(12) United States Patent
Zhu et al.

(10) Patent No.: US 12,225,768 B2
(45) Date of Patent: Feb. 11, 2025

(54) DISPLAY PANEL AND DISPLAY APPARATUS

(71) Applicant: BOE Technology Group Co., Ltd., Beijing (CN)

(72) Inventors: Zhijian Zhu, Beijing (CN); Longfei Fan, Beijing (CN); Pengcheng Lu, Beijing (CN); Xiaochuan Chen, Beijing (CN); Qian Wu, Beijing (CN)

(73) Assignee: BOE Technology Group., Co., Ltd., Beijing (CN)

( * ) Notice: Subject to any disclaimer, the term of this patent is extended or adjusted under 35 U.S.C. 154(b) by 489 days.

(21) Appl. No.: 17/628,678

(22) PCT Filed: Feb. 20, 2021

(86) PCT No.: PCT/CN2021/076970
§ 371 (c)(1),
(2) Date: Jan. 20, 2022

(87) PCT Pub. No.: WO2022/174404
PCT Pub. Date: Aug. 25, 2022

(65) Prior Publication Data
US 2022/0344425 A1 Oct. 27, 2022

(51) Int. Cl.
*H01L 27/32* (2006.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 59/123; G09G 2310/0256;
(Continued)

(56) References Cited

U.S. PATENT DOCUMENTS 7,463,222 B2  12/2008  Fish et al.
8,937,580 B2  1/2015  Miyagawa
(Continued)

FOREIGN PATENT DOCUMENTS

CN    1521712 A    8/2004
CN    1581254 A    2/2005
(Continued)

OTHER PUBLICATIONS

Extended European Search Report, for corresponding European Patent Application No. 21926124.5, dated Aug. 24, 2023, 8 pages.
(Continued)

*Primary Examiner* — Tong-Ho Kim
(74) *Attorney, Agent, or Firm* — Westman, Champlin & Koehler, P.A.

(57) ABSTRACT

A display panel and a display apparatus are provided. The display panel includes a base substrate including a pixel circuit and a light-emitting element. The pixel circuit includes a data writing sub-circuit, a storage sub-circuit, a driver sub-circuit and a first sub-circuit. The data writing sub-circuit is configured to transmit a data signal to a first terminal of the storage sub-circuit in response to a control signal. A control electrode of the driver sub-circuit is coupled to the storage sub-circuit, a first electrode of the driver sub-circuit is configured to receive a first power supply voltage, and a second electrode is coupled to a first electrode of the light-emitting element. The first sub-circuit includes a first transistor, where a gate and a first electrode of the first transistor are both coupled to the same electrode of the driver sub-circuit.

19 Claims, 28 Drawing Sheets

(58) Field of Classification Search
CPC ......... G09G 2320/0238; G09G 3/3233; G09G 2300/0842; G09G 2330/025; G09G 3/32
USPC .......................................................... 257/40
See application file for complete search history.

(56) References Cited

U.S. PATENT DOCUMENTS

| | | | |
|---|---|---|---|
| 9,245,478 | B2 | 1/2016 | Kitazawa |
| 9,378,676 | B2 | 6/2016 | Nomura |
| 9,666,129 | B2 | 5/2017 | Nomura |
| 9,799,267 | B2 | 10/2017 | Nomura |
| 9,824,659 | B2 | 11/2017 | Gu et al. |
| 10,565,932 | B2 | 2/2020 | Zhang |
| 10,607,529 | B2 | 3/2020 | Chen |
| 10,783,829 | B2 | 9/2020 | Liu et al. |
| 10,833,065 | B2 | 11/2020 | Hong |
| 11,074,860 | B2 | 7/2021 | Ding et al. |
| 11,263,953 | B2 | 3/2022 | Feng et al. |
| 11,404,002 | B2 | 8/2022 | Song et al. |
| 11,462,592 | B2 | 10/2022 | Yang et al. |
| 2003/0174152 | A1 | 9/2003 | Noguchi |
| 2005/0030265 | A1 | 2/2005 | Miyagawa |
| 2005/0243031 | A1 | 11/2005 | Fish et al. |
| 2012/0249516 | A1 | 10/2012 | Wacyk et al. |
| 2012/0313118 | A1 | 12/2012 | Wacyk et al. |
| 2013/0027373 | A1 | 1/2013 | Kitazawa |
| 2015/0009105 | A1 | 1/2015 | Nomura |
| 2015/0123109 | A1 | 5/2015 | Miyagawa |
| 2015/0248859 | A1 | 9/2015 | Miyagawa |
| 2016/0267840 | A1 | 9/2016 | Nomura |
| 2017/0169762 | A1 | 6/2017 | Nomura |
| 2017/0221441 | A1 | 8/2017 | Gu et al. |
| 2018/0108290 | A1 | 4/2018 | Chen |
| 2019/0043426 | A1 | 2/2019 | Zhang |
| 2019/0333450 | A1* | 10/2019 | Liu ........................ H10K 59/35 |
| 2019/0386001 | A1 | 12/2019 | Hong |
| 2020/0168161 | A1 | 5/2020 | Ding et al. |
| 2021/0233968 | A1* | 7/2021 | Yang .................... H10K 59/353 |
| 2021/0335202 | A1 | 10/2021 | Feng et al. |
| 2021/0335238 | A1 | 10/2021 | Song et al. |

FOREIGN PATENT DOCUMENTS

| | | |
|---|---|---|
| CN | 1679073 A | 10/2005 |
| CN | 102903324 A | 1/2013 |
| CN | 104282261 A | 1/2015 |
| CN | 105047168 A | 11/2015 |
| CN | 105513524 A | 4/2016 |
| CN | 107505789 A | 12/2017 |
| CN | 108648690 A | 10/2018 |
| CN | 108648718 A | 10/2018 |
| CN | 108735154 A | 11/2018 |
| CN | 108877653 A | 11/2018 |
| CN | 109036279 A | 12/2018 |
| CN | 109754756 A | 5/2019 |
| WO | 2018166245 A1 | 9/2018 |
| WO | 2020024641 A1 | 2/2020 |

OTHER PUBLICATIONS

English Translation of Office Action issued in corresponding Chinese Application No. 202180000236.3, dated Oct. 31, 2024.

* cited by examiner

DISPLAY PANEL AND DISPLAY APPARATUS

CROSS REFERENCE TO RELATED APPLICATION(S)

This application is a Section 371 National Stage Application of International Application No. PCT/CN2021/076970, filed on Feb. 20, 2021, entitled "DISPLAY PANEL AND DISPLAY APPARATUS", the contents of which is incorporated herein by reference in its entirety.

TECHNICAL FIELD

The present disclosure relates to a field of display technologies, and in particular to a display panel and a display apparatus.

BACKGROUND

Micro OLED displays relate to a combination of organic light-emitting diode (OLED) technology and CMOS technology and are related to a cross-integration of the optoelectronics industry and the microelectronics industry, which promotes the development of a new generation of micro display technology, and also promotes the research and development of organic electronics on silicon, and even molecular electronics on silicon.

Micro OLED displays have excellent display characteristics, such as high resolution, high brightness, rich colors, low driving voltage, fast response and low power consumption, and have broad development prospects.

SUMMARY

Some embodiments of the present disclosure provide a display panel. The display panel includes a base substrate and a sub-pixel on the base substrate, wherein the sub-pixel includes a pixel circuit and a light-emitting element, and the pixel circuit includes a data writing sub-circuit, a storage sub-circuit, a driver sub-circuit and a first sub-circuit, wherein the data writing sub-circuit is configured to transmit a data signal to a first terminal of the storage sub-circuit in response to a control signal, the driver sub-circuit includes a control electrode, a first electrode and a second electrode, wherein the control electrode of the driver sub-circuit is coupled to the storage sub-circuit, the first electrode of the driver sub-circuit is configured to receive a first power supply voltage, the second electrode is coupled to a first electrode of the light-emitting element, and the driver sub-circuit is configured to drive the light-emitting element to emit light in response to a voltage of the control electrode, and the first sub-circuit includes a first transistor, wherein a gate of the first transistor and a first electrode of the first transistor are both coupled to the same electrode of the driver sub-circuit.

In some embodiments, the first transistor is a noise reduction transistor. The driver circuit further includes a bias transistor, the noise reduction transistor and the bias transistor are connected in series, and each of the noise reduction transistor and the bias transistor includes a gate, a first electrode and a second electrode, wherein a gate of the noise reduction transistor and a first electrode of the noise reduction transistor are both coupled to the second electrode of the driver sub-circuit, a second electrode of the noise reduction transistor is coupled to a first electrode of the bias transistor, and a gate of the bias transistor is configured to receive a bias voltage, and a second electrode of the bias transistor is configured to receive a predetermined voltage.

In some embodiments, the pixel circuit further includes a resistor connected in series between the second electrode of the driver sub-circuit and the first electrode of the light-emitting element, the resistor and the control electrode of the driver sub-circuit are in the same layer and arranged separately, and resistivity of the resistor is higher than resistivity of the control electrode of the driver sub-circuit.

In some embodiments, the data writing sub-circuit includes a transmission gate circuit, the transmission gate circuit includes a first data writing transistor and a second data writing transistor, each of the first data writing transistor and a second data writing transistor includes a gate, a first electrode and a second electrode, and the control signal includes a first control signal and a second control signal. A gate of the first data writing transistor is configured to receive the first control signal, and a gate of the second data writing transistor is configured to receive the second control signal, a first electrode of the first data writing transistor is coupled to a first electrode of the second data writing transistor, each of the first electrode of the first data writing transistor and the first electrode of the second data writing transistor is coupled to the first terminal of the storage sub-circuit and the control electrode of the driver sub-circuit, a second electrode of the first data writing transistor is coupled to a second electrode of the second data writing transistor, and each of the second electrode of the first data writing transistor and the second electrode of the second data writing transistor is configured to receive the data signal.

In some embodiments, the driver sub-circuit includes a driver transistor, and a gate of the driver transistor, a first electrode of the driver transistor, and a second electrode of the driver transistor are used as the control electrode of the driver sub-circuit, the first electrode of the driver sub-circuit, and the second electrode of the driver sub-circuit, respectively.

In some embodiments, each of the first data writing transistor, the driver transistor, the noise reduction transistor and the bias transistor is an N-type metal-oxide semiconductor field effect transistor, and the second data writing transistor is a P-type metal-oxide semiconductor field effect transistor.

In some embodiments, the resistor and the gate of the noise reduction transistor. are arranged in the same layer as a continuous structure.

In some embodiments, the storage sub-circuit includes a storage capacitor, the storage capacitor includes a first capacitor electrode and a second capacitor electrode, and the first capacitor electrode and the second capacitor electrode are used as the first terminal of the storage sub-circuit and a second terminal of the storage sub-circuit, respectively. The first capacitor electrode and the resistor are arranged in the same layer and insulated from each other.

In some embodiments, in a first direction parallel to the base substrate, the transmission gate circuit is located on one side of the storage capacitor, and the driver transistor, the noise reduction transistor, the bias transistor and the resistor are located on the other side of the storage capacitor.

In some embodiments, in a second direction parallel to the base substrate and perpendicular to the first direction, the second data writing transistor and the first data writing transistor are arranged in sequence, and the driver transistor, the noise reduction transistor and the bias transistor are arranged in sequence.

In some embodiments, in the first direction, the resistor is between the storage capacitor and a combination of the driver transistor, the noise reduction transistor, and the bias transistor.

In some embodiments, the resistor includes a plurality of first sub-segments along the first direction and a plurality of second sub-segments along the second direction, and the plurality of first sub-segments and the plurality of second sub-segments are connected end to end to form a bended structure.

In some embodiments, a shortest distance between the driver transistor and the first data writing transistor is greater than a shortest distance between the driver transistor and the second data writing transistor.

In some embodiments, a shortest distance between the bias transistor and the first data writing transistor is less than a shortest distance between the bias transistor and the second data writing transistor.

In some embodiments, a width of the resistor is less than a width of any one of the gate of the first data writing transistor, the gate of the second data writing transistor, the gate of the driver transistor, the gate of the noise reduction transistor and the gate of the bias transistor.

In some embodiments, the gate of the first data writing transistor, the gate of the second data writing transistor, the gate of the driver transistor, the gate of the noise reduction transistor, the gate of the bias transistor, the first capacitor electrode and the resistor are arranged in the same layer.

In some embodiments, the second data writing transistor and the first data writing transistor are arranged side by side along the second direction, and are symmetrical relative to a symmetry axis along the first direction.

In some embodiments, the second electrode of the driver transistor and the first electrode of the noise reduction transistor are arranged in the same layer as a continuous structure, and/or the second electrode of the noise reduction transistor and the first electrode of the bias transistor are arranged in the same layer as a continuous structure.

In some embodiments, the display panel includes 4 sub-pixels and the 4 sub-pixels constitute a pixel unit group, wherein the 4 sub-pixels are arranged in an array along a first direction and a second direction perpendicular to the first direction, and orthographic projections of second data writing transistors of the 4 sub-pixels on the base substrate are within the same N-type well region in the base substrate.

In some embodiments, resistors of adjacent sub-pixels in the first direction are symmetrical relative to a symmetry axis along the second direction, and resistors of adjacent sub-pixels in the second direction are symmetrical relative to a symmetry axis along the first direction.

In some embodiments, transmission gate circuits of two adjacent sub-pixels in the first direction are symmetrical relative to a symmetry axis along the second direction, and transmission gate circuits of two adjacent sub-pixels in the second direction are symmetrical relative to a symmetry axis along the first direction.

In some embodiments, driver transistors of two adjacent sub-pixels in the first direction are symmetrical relative to a symmetry axis along the second direction, and driver transistors of two adjacent sub-pixels in the second direction are symmetrical relative to a symmetry axis along the first direction.

In some embodiments, noise reduction transistors of two adjacent sub-pixels in the first direction are symmetrical relative to a symmetry axis along the second direction, and noise reduction transistors of two adjacent sub-pixels in the second direction are symmetrical relative to a symmetry axis along the first direction.

In some embodiments, bias transistors of two adjacent sub-pixels in the first direction are symmetrical relative to a symmetry axis along the second direction, and bias transistors of two adjacent sub-pixels in the second direction are symmetrical relative to a symmetry axis along the first direction.

In some embodiments, first capacitor electrodes of adjacent sub-pixels in the first direction are symmetrical relative to a symmetry axis along the second direction, and first capacitor electrodes of adjacent sub-pixels in the second direction are symmetrical relative to a symmetry axis along the first direction.

In some embodiments, wherein orthographic projections of first capacitor electrodes of the 4 sub-pixels on the base substrate are located outside of the N-type well region and are arranged around the N-type well region.

In some embodiments, the pixel circuit further includes an isolation structure coupled to the second electrode of the bias transistor and configured to receive a preset voltage.

In some embodiments, an orthographic projection of at least one of the resistor, the driver transistor, the bias transistor, or the noise reduction transistor on the base substrate is surrounded by an orthographic projection of the isolation structure on the base substrate.

In some embodiments, the isolation structure is coupled to a first conductive layer through a plurality of via holes, and a distribution density of the via holes on a side of the isolation structure approximate to the noise reduction transistor is greater than a distribution density of the via holes on a side of the isolation structure approximate to the storage capacitor.

In some embodiments, the isolation structure is an open-loop structure with an opening, and the first electrode of the driver transistor is located at the opening.

In some embodiments, a width of the gate of the bias transistor is greater than a width of the gate of the driver transistor.

In some embodiments, a shortest distance between the gate of the noise reduction transistor and the isolation structure is greater than a shortest distance between the gate of the driver transistor and the isolation structure.

In some embodiments, a total length of the resistor is greater than a total length of the isolation structure.

Some embodiments of the present disclosure provide a display apparatus, including the display panel described in the foregoing embodiments.

BRIEF DESCRIPTION OF THE DRAWINGS

By reading the detailed description of non-limiting embodiments with reference to the following drawings, other features, purposes and advantages of the present disclosure will become more apparent.

DETAILED DESCRIPTION OF EMBODIMENTS

Figure 1:
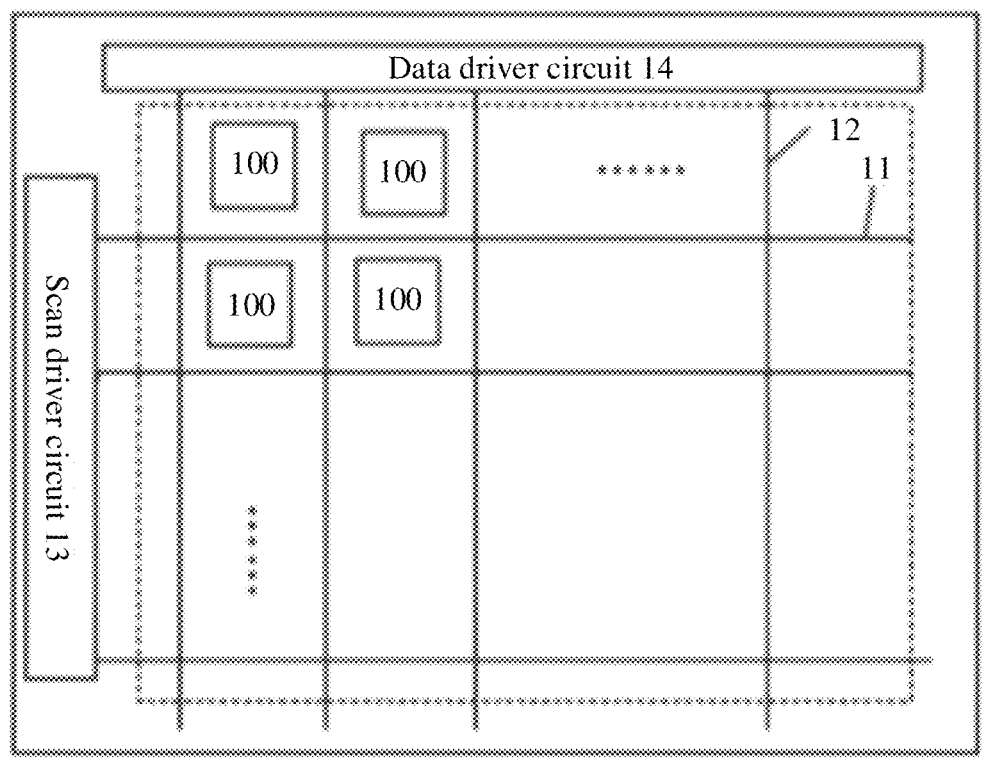
FIG. 1 is a block diagram of a display panel provided by some embodiments of the present disclosure.

The present disclosure will be further described in detail below with reference to the drawings and embodiments. It may be understood that the specific embodiments described herein are merely used to explain the related invention, and should not limit the present disclosure. In addition, it should be noted that for ease of description, only parts related to the present invention are shown in the drawings.

It should be noted that the embodiments of the present disclosure and features in the embodiments may be combined with each other if there is no conflict.

In addition, in the detailed description below, for ease of description, many specific details are set forth to provide a comprehensive understanding of the embodiments of the present disclosure. However, it is obvious that one or more embodiments may also be implemented without these specific details.

It should be understood that although terms "first", "second", etc. may be used to describe different elements here, however, these elements should not be limited by these terms. These terms are merely used to distinguish one element from another element. For example, without departing from the scope of the present disclosure, the first element may be named as the second element, and similarly, the second element may be named as the first element. The term "and/or" as used here includes any or all combinations of one or more related listed items.

It should be understood that when an element or a layer is referred to as being "formed on" another element or layer, the element or layer may be directly or indirectly formed on the another element or layer. That is, for example, there may be an intermediate element or an intermediate layer. In contrast, when an element or a layer is referred to as being "directly formed on" another element or layer, there is no intervening element or layer. Other terms used to describe the relationship (for example, "between" and "directly between", "adjacent" and "directly adjacent", etc.) between elements or layers should be interpreted in a similar manner.

The terms used herein are only for a purpose of describing specific embodiments, and are not intended to limit the embodiments. As used herein, unless the context clearly dictates otherwise, the singular form is also intended to include the plural form. It should also be understood that when terms "comprising" and/or "including" are used herein, it means that the described features, wholes, steps, operations, elements and/or components are present, but the presence or addition of one or more other features, wholes, steps, operations, elements, components, and/or combinations thereof are not excluded.

In present disclosure, unless otherwise specified, expressions "located on the same layer" and "arranged on the same layer" generally indicate that the first component and the second component may use the same material and may be formed by the same patterning process. Expressions "located on different layers" and "arranged on different layers" generally indicate that the first component and the second component are formed by different patterning processes.

Herein, unless otherwise specified, that a first component and a second component are "coupled" means that there is a physical connection between the first component and the second component, so that there is a signal between the two components. For example, for the interaction of electrical signals, magnetic signals, etc., the specific implementation manner may include a direct electrical connection, and may also include a connection through other electronic components.

In the field of OLED (Organic Light-Emitting Diode) display, with a rapid development of high-resolution products, higher requirements are put forward for the structural design of the display panels, such as arrangements of pixels and signal lines. For example, as compared to an OLED display apparatus with a resolution of 4K, a large-size OLED display apparatus with a resolution of 8K have a doubled number of sub-pixel units to be disposed, and thus a doubled pixel density. On the one hand, a line width of signal line is correspondingly reduced, resulting in increased self-resistance of the signal line. On the other hand, there are more overlaps between the signal lines, resulting in increased parasitic capacitance of the signal lines, and these cause the RC load of the signal line to become greater. Correspondingly, the signal delay (RC delay), the voltage drop (IR drop), and the voltage rise (IR rise) caused by the RC load will also become serious. These will seriously affect the display quality of display products.

A Micro OLED display usually has a size less than 100 microns, for example, a size less than 50 microns, etc., involving a combination of organic light-emitting diode (OLED) technology and CMOS technology, where an OLED array is prepared on a silicon-based substrate including CMOS circuits.

Micro OLEDs are widely used in the fields of AR and VR, and with the continuous development of technology, a higher resolution is required. Therefore, higher requirements are put forward for the structural design of the display panel, such as arrangements of pixels and signal lines.

With the display panel provided by at least one embodiment of the present disclosure, a sub-pixel area of (5.45 um×13.6 um) may be achieved by optimized design of the layout and wiring in designing, achieving a high resolution (PPI), an optimized arrangement of pixel circuit array, and better display effect.

FIG. 1 is a block diagram of a display panel provided by some embodiments of the present disclosure. As shown in FIG. 1, the display panel 10 includes a plurality of sub-pixels 100 arranged in an array, a plurality of scanning lines 11 and a plurality of data lines 12. Each sub-pixel 100 includes a light-emitting element and a pixel circuit driving the light-emitting element. The plurality of scanning lines 11 and the plurality of data lines 12 cross each other to define a plurality of pixel regions distributed in an array in a display area, where each pixel region is provided with a pixel circuit of a sub-pixel 100.

As shown in FIG. 1, the display panel may further include a scan driver circuit 13 and a data driver circuit 14 in a non-display area. The scan driver circuit 13 is connected to the pixel circuit through the scanning line 11 to provide various control signals, such as a scanning signal, and the data driver circuit 14 is connected to the pixel circuit through the data line 12 to provide a data signal. Positional relationships between the scan driver circuit 13 and the data driver circuit 14, and between the scanning line 11 and the data line 12 in the display panel shown in FIG. 1 are just examples, and actual arrangement positions may be designed according to needs.

In some embodiments, the display panel 10 may further include a control circuit. For example, the control circuit is configured to control the data driver circuit 14 to apply the data signal, and control the scan driver circuit 13 to apply the scanning signal. An example of this control circuit is a timing control circuit (T-con). The control circuit may be in various forms, for example, the control circuit includes a processor and a memory, where the memory includes executable codes, and the processor executes the executable codes to perform the above method.

For example, the processor may be a central processing unit (CPU) or other form of processing device with data processing capability and/or instruction execution capability, for example, the processor may include a microprocessor, a programmable logic controller (PLC), etc.

For example, the storage device may include one or more computer program products, where the computer program products may include various forms of computer-readable storage media, such as a volatile memory and/or a nonvolatile memory. The volatile memory may include, for example, a random access memory (RAM) and/or a cache memory (cache). The non-volatile memory may include, for example, a read-only memory (ROM), a hard disk, a flash memory, etc. One or more computer program instructions may be stored in the computer-readable storage medium, and the processor may perform functions desired by the program instructions. Various application programs and various data may also be stored in the computer-readable storage medium.

The pixel circuit may include a driver sub-circuit, a data writing sub-circuit, a storage sub-circuit, and a shunt and noise reduction sub-circuit as required, and may further include a compensation sub-circuit, a light emission control sub-circuit, a reset circuit, etc., as required.

Figure 2A:
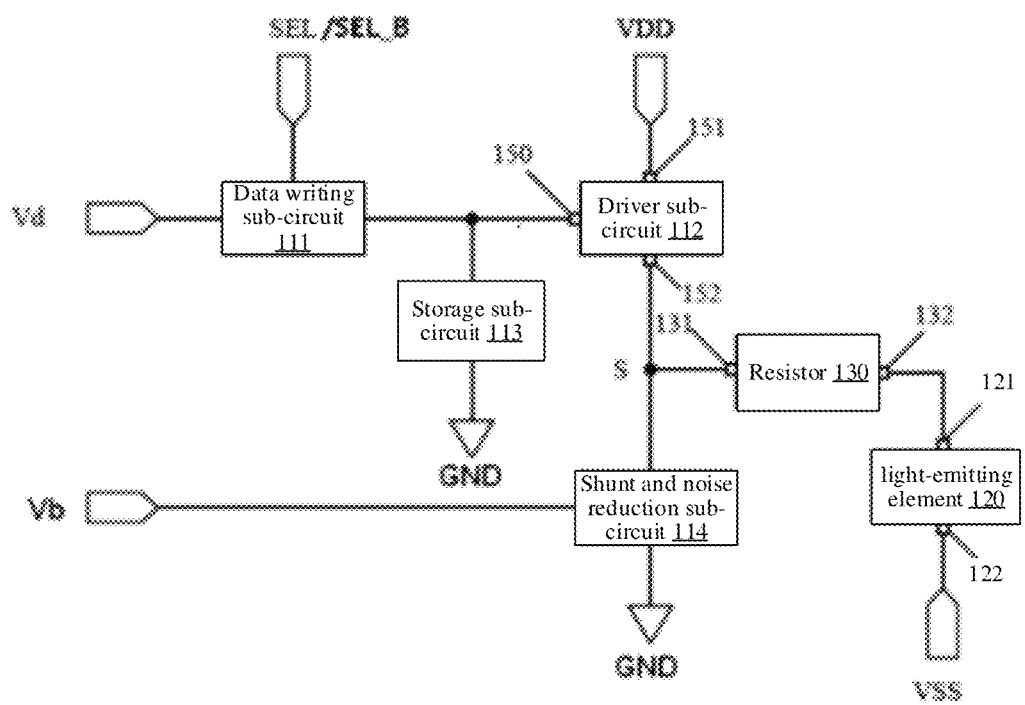
FIG. 2A is a schematic diagram of a pixel circuit provided by some embodiments of the present disclosure.

FIG. 2A is a schematic diagram of a pixel circuit provided by some embodiments of the present disclosure. As shown in FIG. 2A, the pixel circuit includes a data writing sub-circuit 111, a driver sub-circuit 112, a storage sub-circuit 113, and a shunt and noise reduction sub-circuit 114.

An output terminal of the data writing sub-circuit 111 is electrically connected to a first terminal of the storage sub-circuit 113, and the data writing sub-circuit 111 is configured to transmit the data signal Vd to the first terminal of the storage sub-circuit 113 in response to the control signals (including a first control signal SEL and a second control signal SEL_B). A second terminal of the storage sub-circuit 113 is, for example, configured to be electrically connected to a ground voltage GND.

The driver sub-circuit 112 includes a control electrode (control terminal) 150, a first electrode (first terminal) 151, and a second electrode (second terminal) 152, where the control electrode 150 of the driver sub-circuit is electrically connected to the first terminal of the storage sub-circuit 113, and the first electrode 151 of the driver sub-circuit 112 is configured to receive a first power supply voltage VDD, and the second electrode 152 of the driver sub-circuit 112 and a first electrode 121 of a light-emitting element 120 are electrically connected to a first node S.

The driver sub-circuit 112 is configured to drive the light-emitting element 120 to emit light in response to a voltage of the first terminal of the storage sub-circuit 113. A second electrode 122 of the light-emitting element 120 is, for example, configured to receive a second power supply voltage VSS. In some embodiments, the first power supply voltage VDD is, for example, a high voltage, and the second power supply voltage VSS is, for example, a low voltage.

The shunt and noise reduction sub-circuit 114 includes a control terminal, a first terminal and a second terminal. Specifically, the control terminal of the shunt and noise reduction sub-circuit 114 receives a bias signal Vb, the first terminal of the shunt and noise reduction sub-circuit 114 is electrically connected to the first node S, and the second terminal of the shunt and noise reduction sub-circuit 114 receives the ground voltage GND. For example, the bias signal Vb is a constant voltage signal, and is also called as a bias voltage Vb, for example, it is 0.8 V to 1 V. The shunt and noise reduction sub-circuit 114 is configured to provide a constant current under the action of the bias signal Vb to realize a shunt function, so that a current passing through a branch where the light-emitting element is located is relatively small. Accordingly, a voltage applied to the light-emitting element 120 has a linear relationship with the data signal, which is conducive to fine control of the gray scale, thereby improving the display quality. In addition, the shunt and noise reduction sub-circuit 114 may also reduce a voltage fluctuation at the first node S caused by the voltage noise of the bias signal Vb, which will be further described in conjunction with a specific circuit below.

As shown in FIG. 2A, the pixel circuit further includes a resistor 130. A first terminal 131 of the resistor 130 and the second electrode 152 of the driver sub-circuit 112 are electrically connected to the first node S, and a second terminal 132 is electrically connected to the first electrode 121 of the light-emitting element 120, that is, the second electrode 152 of the driver sub-circuit 112 is electrically connected to the first electrode 121 of the light-emitting element 120 through the resistor 130.

For example, the resistor 130 is a constant resistance or a variable resistance, and may also be an equivalent resistance formed by other devices (such as a transistor).

For example, the resistor 130 and the control electrode 150 of the driver sub-circuit 112 are arranged in the same layer and insulated from each other, and resistivity of the resistor is higher than resistivity of the control electrode of the driver sub-circuit, that is, conductivity of the control electrode of the driver sub-circuit is higher than conductivity of the resistor. For example, the resistivity of the resistor is ten times or more the resistivity of the control electrode.

In the embodiments of the present disclosure, at least one of the data writing sub-circuit 111, the driver sub-circuit 112, the storage sub-circuit 113, and the shunt and noise reduction sub-circuit 114 is implemented by a transistor. Each transistor used may be a thin film transistor, a field effect transistor, or other switching devices with the same characteristics, and in the embodiments of the present disclosure, a metal-oxide semiconductor field effect transistor is used as an example for description. A source and a drain of the transistor used here may be symmetrical in structure, and thus the source and the drain may be structurally indistinguishable. In the embodiments of the present disclosure, in order to distinguish the two electrodes of the transistor other than the gate of the transistor, one electrode is directly described as a first electrode, and the other electrode as a second electrode. For example, the drain serves as the first electrode and the source serves as the second electrode. In addition, transistors may be divided into N-type transistors and P-type transistors according to the characteristics thereof. When a transistor is a P-type transistor, a turn-on voltage is a low-level voltage (e.g., 0 V, −5 V, −10 V or other suitable voltage), and a turn-off voltage is a high-level voltage (e.g., 5 V, 10 V or other suitable voltage); when a transistor is an N-type transistor, a turn-on voltage is a high-level voltage (e.g., 5 V, 10 V or other suitable voltage), and a turn-off voltage is a low-level voltage (e.g., 0 V, −5 V, 30-10 V or other suitable voltage).

The display panel provided by the embodiments of the present disclosure may use a rigid substrate, such as a glass substrate, a silicon substrate, etc., or may be made of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), tri-cellulose acetate (TAC), cyclic olefin polymer (COP), cyclic olefin copolymer (COC), etc. The embodiments of the present disclosure are described by taking a silicon substrate as an example, that is, the pixel structure is prepared on the silicon substrate, however, the embodiments of the present disclosure do not limit this.

In an embodiment, the pixel circuit includes a complementary metal oxide semiconductor circuit (CMOS circuit), that is, the pixel circuit is prepared on a single crystal silicon base substrate. Relying on mature CMOS integrated circuit technology, silicon-based technology can achieve relatively high precision (e.g., PPI can reach 6,500 or even more than 10,000).

In some embodiments of the present disclosure, the data writing sub-circuit 111 may include a transmission gate circuit composed of two complementary transistors connected in parallel with each other; and the control signals includes two inverted control signals. That the data writing sub-circuit 111 adopts the transmission gate structure circuit may help to transmit the data signal to the first terminal of the storage sub-circuit 113 without loss. Specifically, the data writing sub-circuit includes a first control electrode, a second control electrode and a first terminal, for example, serving as a signal input terminal and a second terminal, for example, serving as the signal output terminal. The first control electrode and the second control electrode of the data writing sub-circuit are respectively configured to receive a first control signal and a second control signal, the first terminal of the data writing sub-circuit is configured to receive the data signal, and a second terminal of the data writing sub-circuit is electrically connected to the first terminal of the storage sub-circuit and is configured to transmit the data signal to the first terminal of the storage sub-circuit in response to the first control signal and the second control signal.

Figure 2B:
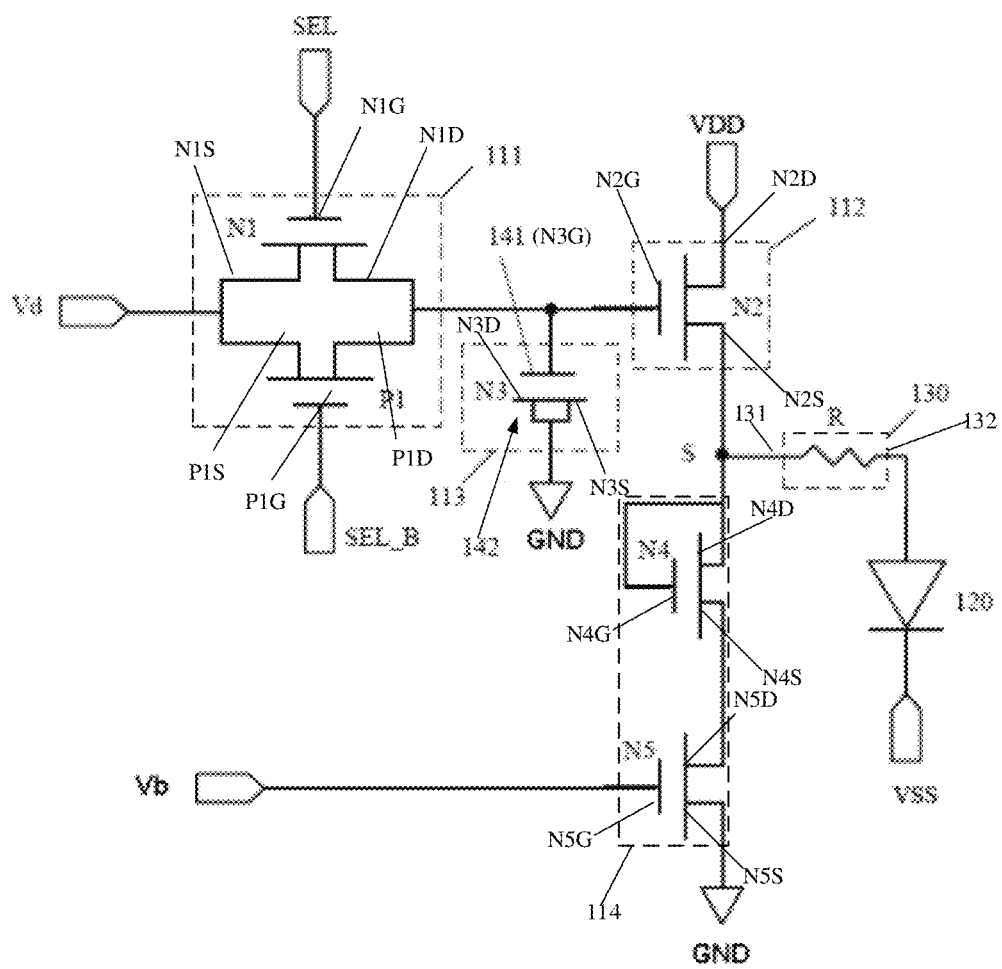
FIG. 2B is a schematic circuit diagram of a specific implementation example of the pixel circuit shown in FIG. 2A.

FIG. 2B is a schematic circuit diagram of a specific implementation example of the pixel circuit shown in FIG. 2A. As shown in FIG. 2B, the data writing sub-circuit 111 includes a transmission gate circuit, and the data writing sub-circuit 111 includes a first data writing transistor N1 and a second data writing transistor P1 connected in parallel with each other. The first data writing transistor N1 and the second data writing transistor P1 are an N-type metal-oxide semiconductor (NMOS) field effect transistor and a P-type metal-oxide semiconductor (PMOS) field effect transistor, respectively. The control signals include the first control signal SEL and the second control signal SEL_B that are mutually inverted. A gate N1G of the first data writing transistor N1 serves as the first control electrode of the data writing sub-circuit 111 and is configured to receive the first control signal SEL. A gate P1G of the second data writing transistor P1 serves as the second control electrode of the data writing sub-circuit and is configured to receive the second control signal SEL_B. A second electrode P1S of the second data writing transistor P1 and a second electrode N1S of the first data writing transistor N1 are electrically connected to serve as the first terminal of the data writing sub-circuit, and are configured to receive the data signal Vd. A first electrode P1D of the second data writing transistor P1 and a first electrode N1D of the first data writing transistor N1 are electrically connected to serve as the second terminal of the data writing sub-circuit, and are electrically connected to the control electrode 150 of the driver sub-circuit 112.

In some embodiments, the first data writing transistor N1 and the second data writing transistor P1 have the same size and the same channel width to length ratio.

The data writing sub-circuit 111 utilizes complementary electrical characteristics of the transistors, and thus has a low on-state resistance regardless of whether a high level or a low level is transmitted. Accordingly, the data writing sub-circuit 111 has the advantage of transmitting electrical signal transmission integrally, and may transmit the data signal Vd to the first terminal of the storage sub-circuit 113 without loss.

As shown in FIG. 2B, the driver sub-circuit 112 includes a driver transistor N2, for example, the driver transistor N2 is an N-type metal-oxide semiconductor (NMOS) field effect transistor. A gate N2G, a first electrode N2D and a second electrode N2S of the driver transistor N2 serve as the control electrode, the first electrode and the second electrode of the driver sub-circuit 112, respectively. Specifically, the gate N2G of the driver transistor N2 is electrically connected to the second terminal of the data writing sub-circuit 111 and the first terminal of the storage sub-circuit 113, the first electrode N2D of the driver transistor N2 receives the first power supply voltage VDD, and the second electrode N2S of the driver transistor N2 is connected to the first electrode 121 of the light-emitting element 120.

As shown in FIG. 2B, the storage sub-circuit includes a storage transistor N3, such as an N-type metal-oxide semiconductor (NMOS) field effect transistor. The storage transistor N3 includes a gate N3G, a first electrode N3D, a second electrode N3S and an active region between the first electrode and the second electrode, and the storage transistor N3 serves as a storage capacitor Cst. The gate N3G of the storage transistor N3 serves as a first capacitor electrode 141 of the storage capacitor, and the first electrode N3D and the second electrode N3S of the storage transistor are electrically connected to the first electrode, the second electrode and the active region of the storage transistor N3, to serve as a second capacitor electrode 142 of the storage capacitor together. The first electrode, the active region and the second electrode of the storage transistor N3 serve as a first region, a second region and a third region of the second capacitor electrode 142, respectively, where the first region and the second region have the same carrier mobility, which is different from a carrier mobility of the third region. The first capacitor electrode 141 and the second capacitor electrode 142 serve as the first terminal and the second terminal of the storage sub-circuit 113, respectively. For details, refer to FIG. 2C, and FIG. 2C is an equivalent circuit diagram to FIG. 2B, where the storage transistor N3 is directly shown in the form of the storage capacitor Cst.

The storage transistor N3, the first data writing transistor N1 and the driver transistor N2 are each an N-type metal-oxide semiconductor (NMOS) field effect transistor, which may be formed through the same process, so that the storage capacitor Cst may be formed simultaneously when the first data writing transistor N1 and the driver transistor N2 are formed, and it is avoided that an additional other electrode layers is introduced to the form the storage capacitor, which may reduce the process difficulty and save costs.

Figure 2C:
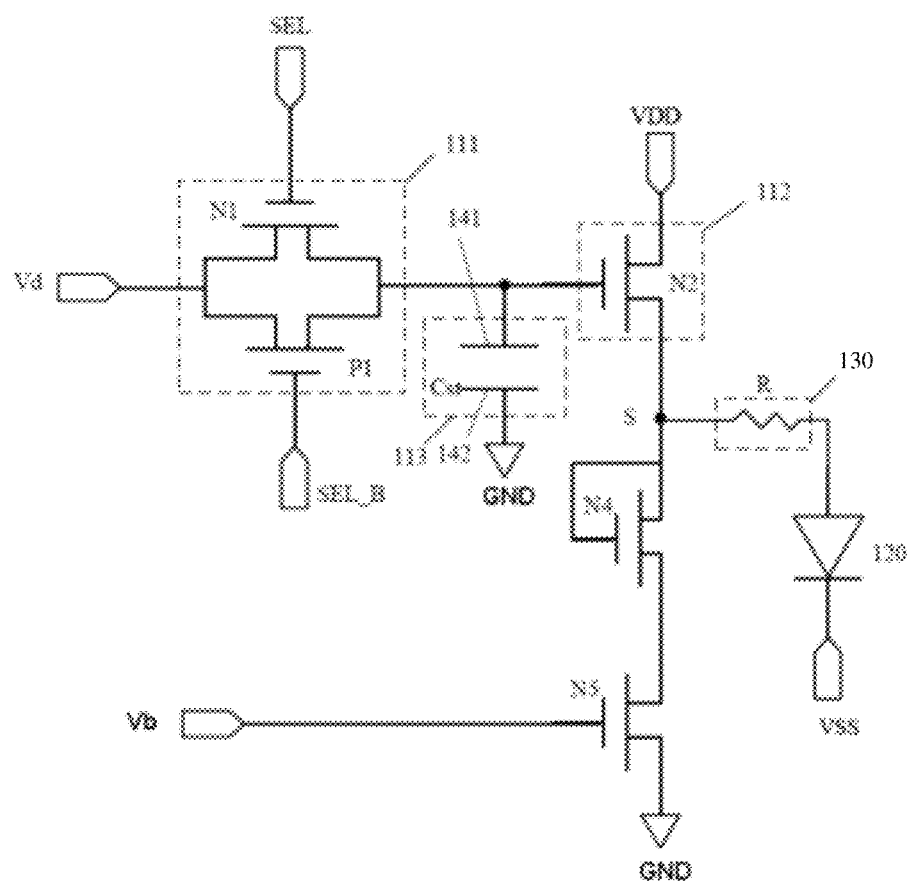
FIG. 2C is an equivalent circuit diagram to FIG. 2B, where a storage transistor is shown in a form of a storage capacitor.

As shown in FIGS. 2B and 2C, the pixel circuit further includes a resistor 130. A first terminal 131 of the resistor 130 and the second electrode 152 of the driver sub-circuit 112 are electrically connected to the first node S, and a second terminal 132 is electrically connected to the first electrode 121 of the light-emitting element 120, that is, the second electrode 152 of the driver sub-circuit 112 is electrically connected to the first electrode 121 of the light-emitting element 120 through the resistor 130. By providing a resistor R, it is possible to avoid defects such as dark lines in the display panel caused by short-circuiting the first electrode 121 and the second electrode 122 of the light-emitting element 120 in the sub-pixel due to process fluctuations.

For example, the resistor 130 includes a resistance R, and the resistance R is a constant resistance or a variable resistance, and may also be an equivalent resistance formed by other devices (such as a transistor).

For example, the resistor 130 and the control electrode 150 of the driver sub-circuit 112, i.e., the gate N2G of the driver transistor N2, are arranged in the same layer and insulated from each other, and the resistivity of the resistor 130 is higher than resistivity of the control electrode of the driver sub-circuit, that is, conductivity of the control electrode of the driver sub-circuit is higher than the conductivity of the resistor. For example, the resistivity of the resistor is above ten times of the resistivity of the control electrode.

In some embodiments, the resistor 130 includes a resistance R. For example, a PN junction is formed between the second electrode 152 of the driver sub-circuit 112 and a base substrate, and a resistance value of the resistor 130 is configured such that when the driver transistor N2 works in a saturation region, that is, when the pixel circuit works to drive the light-emitting element 120 to emit light, the PN junction is turned off. In this case, even if a short circuit occurs between the two electrodes of the light-emitting element 120, a potential at the second electrode 152 may be protected due to a voltage drop across the resistor 130, thereby avoiding a circuit failure.

It should be noted that the "same layer arrangement" mentioned in the present disclosure refers to a structure formed by two (or more than two) structures formed through the same deposition process and patterned through the same patterning process, and their materials may be the same or different. For example, materials for forming precursors of multiple structures arranged in the same layer are the same, and final formed materials may be the same or different. The "integrated structure" in the present disclosure refers to two (or more than two) structures that are formed through the same deposition process and patterned through the same patterning process, and their materials may be the same or different.

With this arrangement, the control electrode of the driver sub-circuit and the resistor may be formed in the same patterning process, thereby saving process.

In some embodiments, material of the resistor and material of the control electrode of the driver sub-circuit are both polysilicon, and a doping concentration of the resistor is lower than a doping concentration of the control electrode, therefore, the resistor has higher resistivity than the control electrode. For example, the resistor may be made of intrinsic polysilicon or lightly doped polysilicon, and the control electrode may be made of heavily doped polysilicon.

In other embodiments, the materials of the control electrode and the resistor may be different. For example, the materials of the control electrode and the resistor may respectively include a metal and a metal oxide corresponding to the metal. For example, the metal may include gold (Au), silver (Ag), copper (Cu), aluminum (Al), molybdenum (Mo), magnesium (Mg), tungsten (W), and alloy materials combined with the above metals.

In some embodiments, as shown in FIGS. 2B and 2C, the light-emitting element 120 is specifically implemented as an organic light-emitting diode (OLED). For example, the light-emitting element 120 may be an OLED with a top-emission structure, which may emit red light, green light, blue light, white light, or the like. For example, the light-emitting element 120 is a Micro OLED. The embodiments of the present disclosure do not limit the specific structure of the light-emitting element. For example, the first electrode 121 of the light-emitting element 120 is an anode of the OLED, and the second electrode 122 is a cathode of the OLED, that is, the pixel circuit has a common cathode structure. However, the embodiments of the present disclosure do not limit this, and according to the change of the circuit structure, the pixel circuit may also have a common anode structure.

In some embodiments, as shown in FIGS. 2B and 2C, the shunt and noise reduction sub-circuit 114 includes a noise reduction transistor N4 and a bias transistor N5 connected in series, where the noise reduction transistor N4 includes a gate N4G, a first electrode N4D, and a second electrode N4S, and the bias transistor N5 includes a gate N5G, a first electrode N5D, and a second electrode N5S. Each of the gate N4G and the first electrode N4D of the noise reduction transistor N4 is electrically connected to the second electrode N2S of the driver transistor N2 at the first node S, the second electrode N4S of the noise reduction transistor N4 is electrically connected to the first electrode N5D of the bias transistor N5, the gate N5G of the bias transistor N5 receives the bias voltage Vb, and the second electrode N5S of the bias transistor N5 is grounded, that is, it receives the ground voltage GND. The gate N5G of the bias transistor N5 serves as the control terminal of the shunt and noise reduction sub-circuit 114, the gate N4G and the first electrode N4D included in the noise reduction transistor N4 serve as the first terminal of the shunt and noise reduction sub-circuit 114 together, and the second electrode N5S of the bias transistor N5 serves as the second terminal of the shunt and noise reduction sub-circuit 114.

As shown in FIGS. 2B and 2C, the bias transistor N5 and the noise reduction transistor N4 are connected in series as a shunt circuit, which may shunt a larger current generated by the driver transistor N2 when the driver transistor N2 works in the saturation region, and damage to the light-emitting element 120 caused by excessive current flowing through the light-emitting element 120 is avoided. At the same time, it is also possible to initialize the anode of the light-emitting element 120 when the sub-pixels are converted between high and low gray levels, so as to avoid a high potential remaining at the anode, and the display quality is ensured. The gate N4G and the first electrode N4D of the noise reduction transistor N4 are electrically connected to the first node S, the noise reduction transistor N4 is equivalent to a diode in the shunt circuit, which avoids or reduces voltage fluctuation at the second electrode N2S of the driver transistor N2 caused by a voltage noise of the bias voltage Vb.

As shown in FIGS. 2B and 2C, each of the gate N4G and the first electrode N4D of the noise reduction transistor N4 is electrically connected to the first node S, that is, the noise reduction transistor N4 is arranged on a branch connected to the second electrode N2S of the driver transistor N2. In other embodiments, the noise reduction transistor N4 may also be arranged on a branch connected to the gate N2G of the driver transistor N2 or a branch connected to the first electrode N2D of the driver transistor N2, so as to reduce noise and stabilize the voltage, which will not be repeated here.

It should be noted that in the description of the embodiments of the present disclosure, the symbol Vd can represent both the data signal terminal and a level of the data signal. Similarly, the symbol SEL can represent both the first control signal and a first control signal terminal, and the symbol SEL_B can represent both the second control signal and a second control signal terminal. The symbol GND can represent both the ground voltage and a ground terminal; the symbol VDD can represent both a first power supply voltage terminal and the first power supply voltage, the symbol VSS can both represent a second power supply voltage terminal and the second power supply voltage, and Vb can represent both a bias signal terminal and a level of the bias signal, i.e., the bias voltage.

Figure 2D:
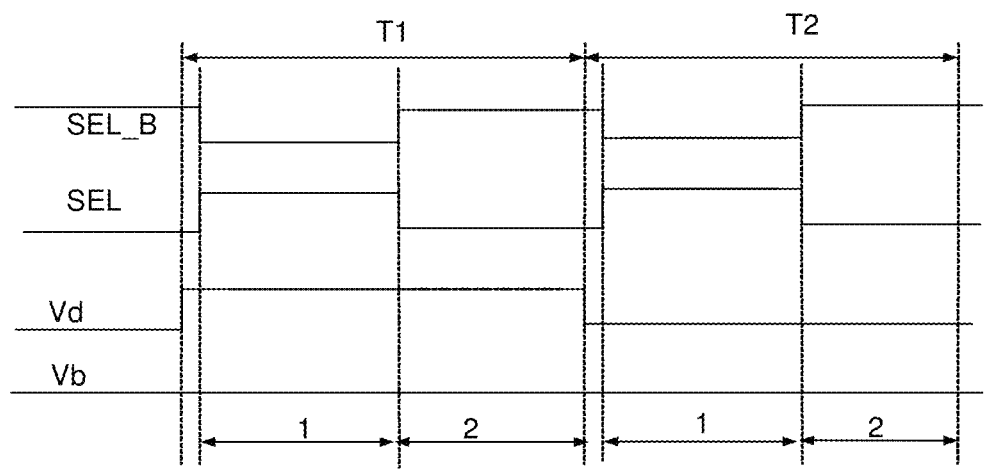
FIG. 2D shows a signal timing diagram of the pixel circuit shown in FIG. 2B.

FIG. 2D shows a signal timing diagram of the pixel circuit shown in FIG. 2B. The working principle of the pixel circuit shown in FIG. 2B will be described below in conjunction with the signal timing diagram shown in FIG. 2D. For example, the first data writing transistor and the driver transistor are N-type transistors, and the second data writing transistor is a P-type transistor. However, the embodiments of the present disclosure do not limit this.

FIG. 2D shows a waveform diagram of each signal in two consecutive display periods T1 and T2, for example, the data signal Vd has a high gray scale voltage during the display period T1 and has a low gray scale voltage during the display period T2.

For example, as shown in FIG. 2D, a display process of each frame of image includes a data writing phase 1 and a light emitting phase 2. A working process of the pixel circuit includes: in the data writing phase 1, the first control signal SEL and the second control signal SEL_B are both turn-on signals, the first data writing transistor N1 and the second data writing transistor P1 are turned on, and the data signal Vd is transmitted to the gate of the driver transistor N2 through the first data writing transistor N1 and/or the second data writing transistor P1; in the light emitting phase 2, the first control signal SEL and the second control signal SEL_B are both turn-off signals, a voltage across the two terminals of the storage capacitor Cst remains unchanged due to bootstrap effect of the storage capacitor Cst, and the driver transistor N2 works in a saturated state with a current remaining unchanged and drives the light-emitting element 120 to emit light. When the pixel circuit enters the display period T2 from the display period T1, the data signal Vd changes from a high gray scale voltage to a low gray scale voltage, and the bias transistor N5 generates a stable drain current under the control of a second common voltage Vcom2, where the drain current may quickly discharge charges stored in the anode of the OLED when the display gray scale of the OLED needs to be changed quickly. For example, the discharge process occurs during the data writing phase 1 of the display period T2, and thus in the light-emitting phase 2 of the display period T2, the voltage of the anode of the OLED may decrease rapidly, which may realize better dynamic contrast and improve the display quality.

For example, in the light-emitting phase, when writing gray scale data, the light-emitting element OLED has a light-emitting current on an order of nanoamperes (e.g., several nanoamperes). The bias transistor N5 works in a saturation region under the control of the bias signal, i.e., the bias voltage Vb, and generates a current on an order of microamperes (e.g., 1 microampere). As a result, almost all the current flowing through the driver transistor N2 flows into the bias transistor N5, and at this time, a voltage of the first node S has a linear relationship with the data signal (data voltage) Vd.

For example, the bias transistor N5 works in the saturation region under the control of the bias signal Vb, whereas a voltage difference between the gate and a source of the bias transistor N5 is (Vb−GND), which is a fixed value. At this time, the current flowing through the bias transistor N5 is constant, and thus the bias transistor N5 may be regarded as a current source.

For example, when the first node S is electrically connected to the light-emitting element 120 through the resistor 130, since a current flowing through the light-emitting element 120 is extremely small, the voltage of the first node S may be approximately equal to a voltage of the first electrode 121 of the light-emitting element 120. That is, the voltage of the first electrode 121 of the light-emitting element 120 is in a linear relationship with the data signal (data voltage) Vd, so that it is possible to realize fine control of the gray scale, and the display quality is improved.

In some embodiments, the first control signal SEL and the second control signal SEL_B are differential complementary signals with the same amplitude but inverted phases, which may help to improve anti-interference performance of the circuit. For example, the first control signal SEL and the second control signal SEL_B may be output by the same gate driver circuit unit (such as a GOA unit), thereby simplifying the circuit.

For example, as shown in FIG. 1, the display panel 10 may further include a data driver circuit 14 and a scan driver circuit 13. The data driver circuit 14 is configured to send out data signals, such as the above-mentioned data signal Vd, according to needs (e.g., an image signal input to a display apparatus). The scan driver circuit 13 is configured to output various scanning signals including, for example, the above-mentioned first control signal SEL and second control signal SEL_B, and the scan driver circuit 13 is, for example, an integrated circuit chip (IC), or a gate driver circuit directly prepared on the display panel (GOA).

In some embodiments, the display panel adopts a silicon substrate as the base substrate 101, where the pixel circuit, the data driver circuit 14 and the scan driver circuit 13 may all be integrated on the silicon substrate. In this case, due to relatively high precision of a silicon-based circuit, the data driver circuit 14 and the scan driver circuit 13 may also be formed in an area corresponding to the display area of the display panel, but not necessarily in the non-display area.

In some embodiments, the display panel 10 further includes a control circuit. For example, the control circuit is configured to control the data driver circuit 14 to apply the data signal Vd, and to control the scan driver circuit 13 to apply various scanning signals. An example of the control circuit is a timing control circuit (T-con). The control circuit may be in various forms, for example, a processor and a memory are included, where the memory includes executable codes, and the processor executes the executable codes to perform the above detection method.

In some embodiments, the processor may be a central processing unit (CPU) or other form of processing device with data processing capability and/or instruction execution capability, for example, the processor may include a microprocessor, a programmable logic controller (PLC), etc.

In some embodiments, the storage device may include one or more computer program products, where the computer program products may include various forms of computer-readable storage media, such as a volatile memory and/or a nonvolatile memory. The volatile memory may include, for example, a random access memory (RAM) and/or a cache memory (cache). The non-volatile memory may include, for example, a read-only memory (ROM), a hard disk, a flash memory, etc. One or more computer program instructions may be stored in the computer-readable storage medium, and the processor may perform functions desired by the program instructions. Various application programs and various data, such as electrical characteristic parameters obtained in the above-mentioned detection method, may also be stored in the computer-readable storage medium.

The pixel circuit shown in FIGS. 2B and 2C will be taken as an example to illustrate the display panel provided by at least one embodiment of the present disclosure, but the embodiments of the present disclosure are not limited thereto.

Figure 3A:
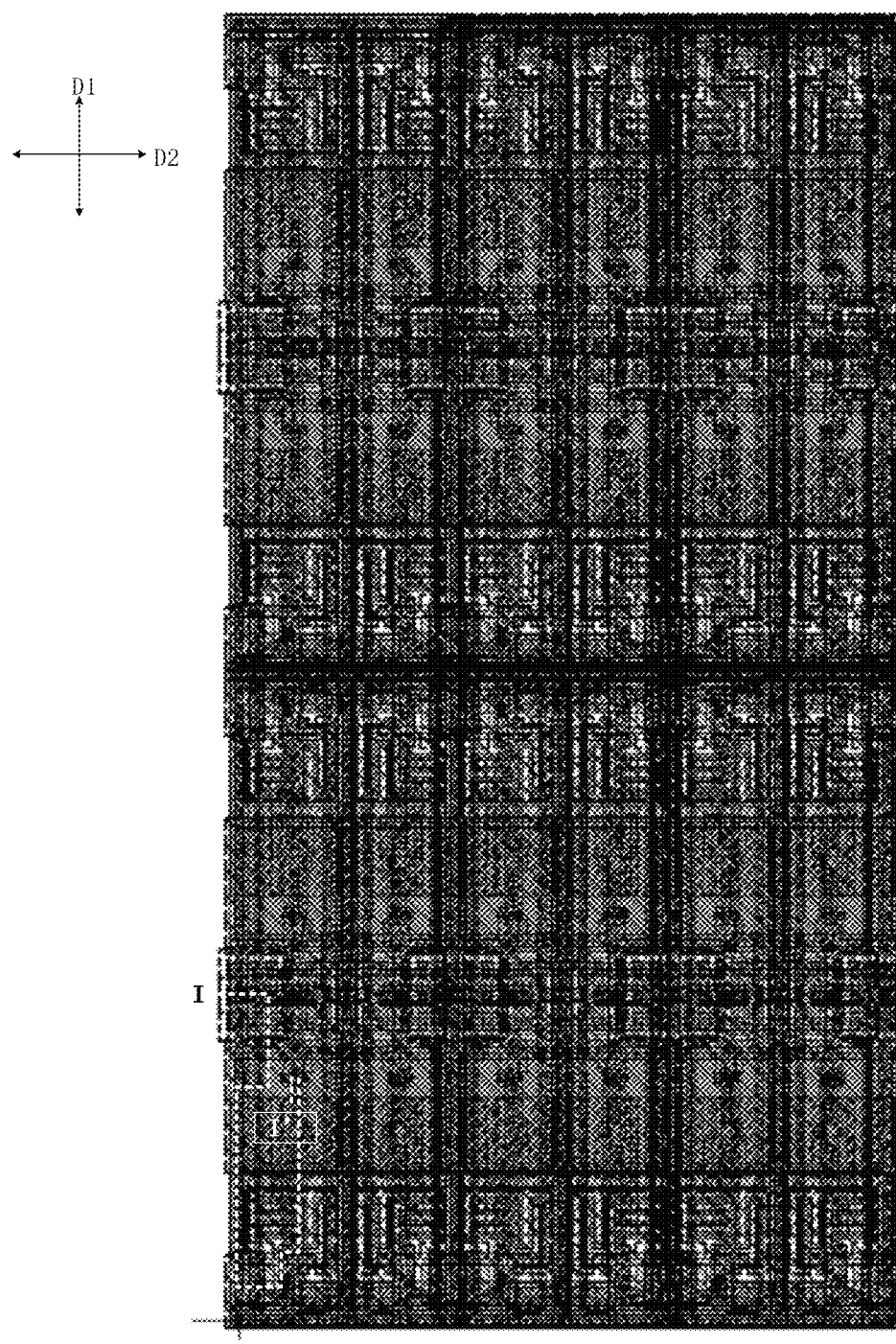
FIG. 3A is a schematic diagram of a display panel provided by some embodiments of the present disclosure.

FIG. 3A is a schematic diagram of a display panel provided by some embodiments of the present disclosure. For example, as shown in FIG. 3A, the display panel 10 includes the base substrate 101, and the plurality of sub-pixels 100 are located on the base substrate 101. The plurality of sub-pixels 100 are arranged in a sub-pixel array, where a column direction of the sub-pixel array is a first direction D1, a row direction of the sub-pixel array is a second direction D2, and the first direction D1 and the second direction D2 intersect, for example, they are perpendicular to each other. FIG. 3A exemplarily shows four rows and six columns of sub-pixels, that is, four pixel rows and six pixel columns.

For example, the base substrate 101 may be a rigid substrate, such as a glass substrate, a silicon substrate, etc., or may be made of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), tri-cellulose acetate (TAC), cyclic olefin polymer (COP), cyclic olefin copolymer (COC), etc. The embodiments of the present disclosure are described by taking an example that a silicon substrate serves as the base substrate 101, that is, the pixel structure is prepared on the silicon substrate, however, the embodiments of the present disclosure do not limit thereto.

For example, the base substrate 101 includes single crystal silicon or high-purity silicon. The pixel circuit is formed on the base substrate 101 through a CMOS semiconductor process, for example, active regions (including channel regions of the transistors), the first electrodes and the second electrodes of the transistors are formed on the base substrate 101 through a doping process, each insulating layer is formed through a silicon oxidation process or a chemical vapor deposition (CVD) process, and a plurality of conductive layers are formed through a sputtering process, so as to form a wiring structure, etc. An active region of each transistor is located inside the base substrate 101.

Figure 3B:
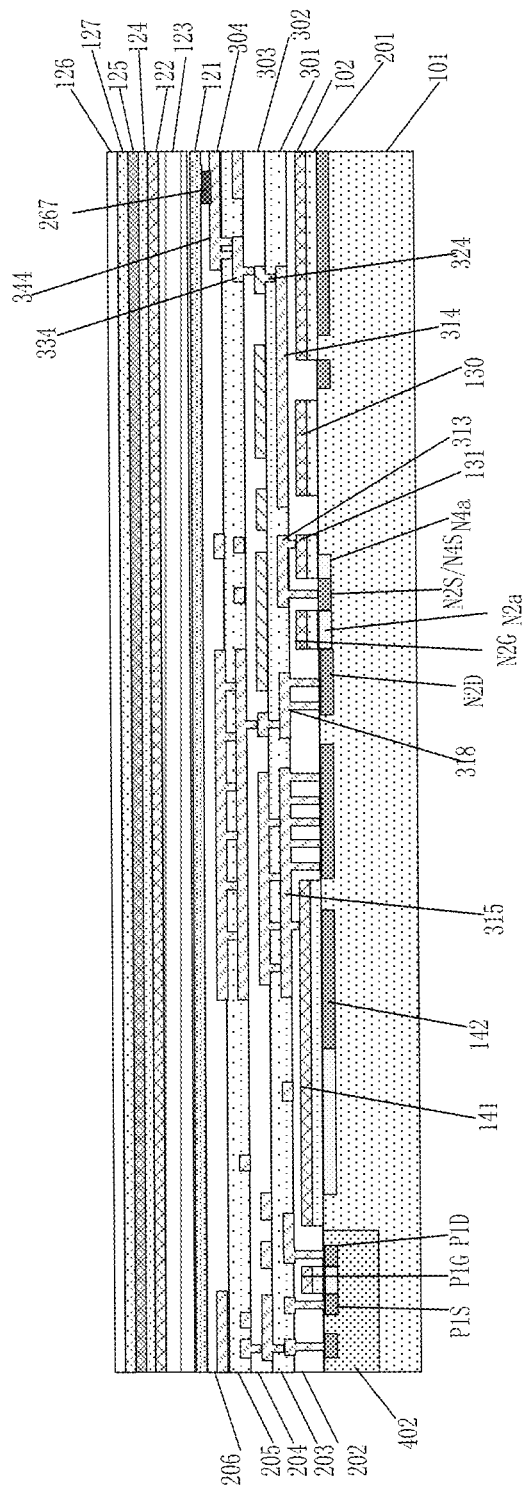
FIG. 3B is a sectional view of FIG. 3A taken along the section line I-I'.

FIG. 3B is a sectional view of FIG. 3A taken along the section line I-I'. For clarity, some wires or electrode structures that are not directly connected are omitted in FIG. 3B.

For example, as shown in FIG. 3B, the display panel 10 includes the base substrate 101, a first insulating layer 201, a polysilicon layer 102, a second insulating layer 202, a first conductive layer 301, a third insulating layer 203, a second conductive layer 302, a fourth insulating layer 204, a third conductive layer 303, a fifth insulating layer 205, and a fourth conductive layer 304. Structures in the display panel 10 will be described by level below, and FIG. 3B will be taken as a reference and will be described together.

Figure 4A:
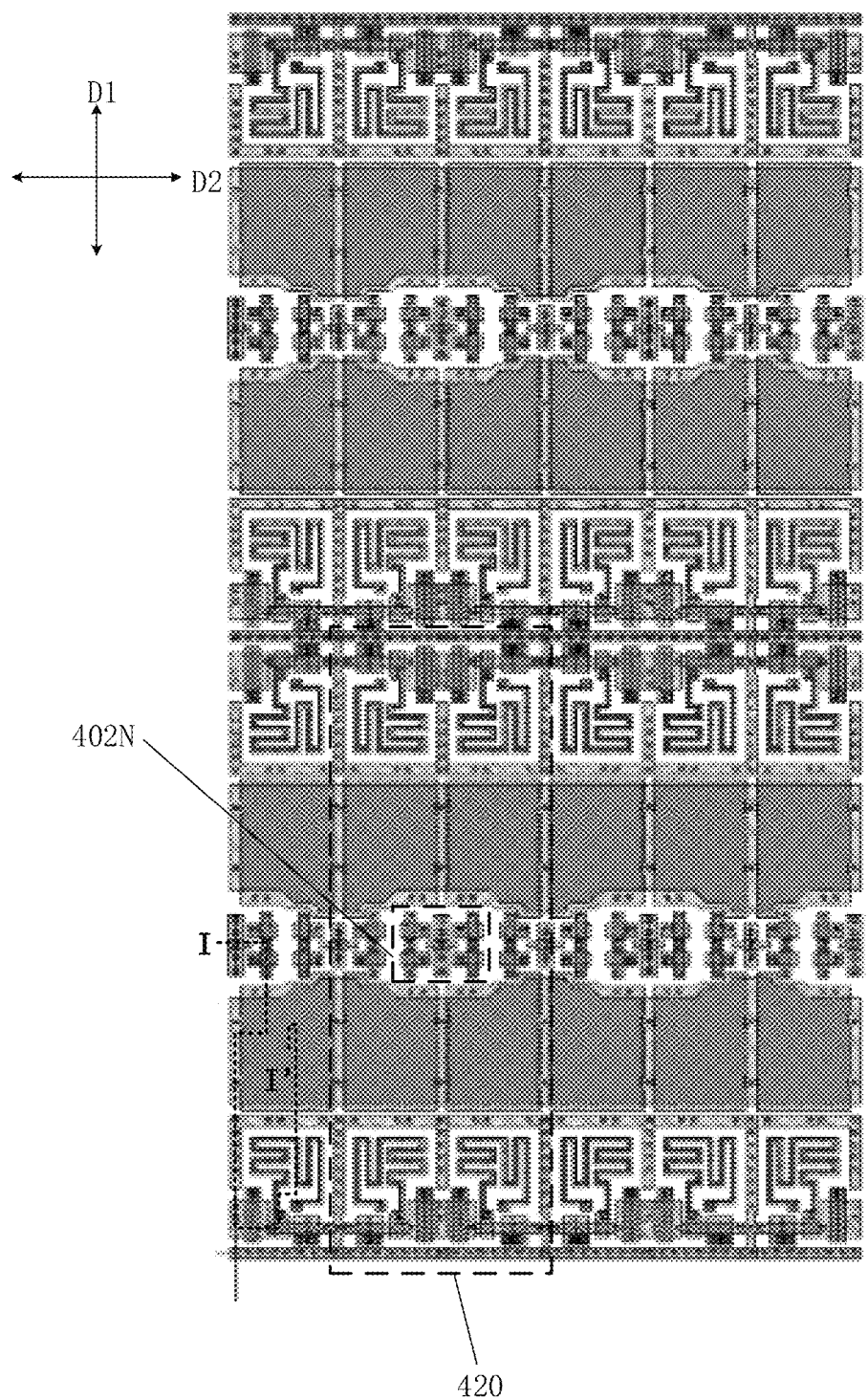
FIG. 4A is a schematic diagram of a display panel provided by some embodiments of the present disclosure.
Figure 4B:
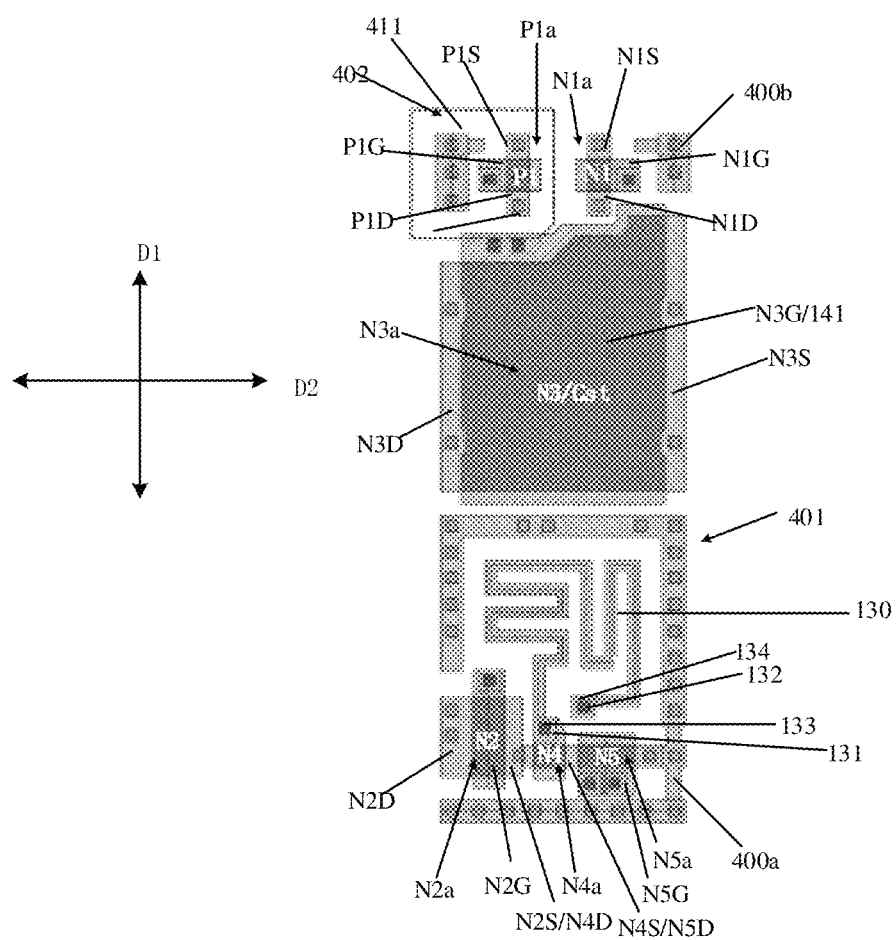
FIG. 4B is a schematic diagram of a sub-pixel in FIG. 4A.

For clarity and convenience of description, FIG. 4A shows a part of the display panel 10 under the first conductive layer 301, that is, the base substrate 101, and the first insulating layer 201, the polysilicon layer 102 and the second insulating layer 202 on the base substrate 101, including the respective transistors (P1, N1, N2, N4, N5), the storage capacitor Cst (i.e., the storage transistor N3) and resistor 130. FIG. 4B shows a sub-pixel 100 in FIG. 4A, for example, it shows an enlarged schematic diagram of the sub-pixel at the lower left in FIG. 4A. For clarity, FIG. 4A also shows the section line I-I' in FIG. 3A correspondingly.

As shown in FIG. 4B, for example, in a direction parallel to a surface of the base substrate 101, a transmission gate circuit including the first data writing transistor N1 and the second data writing transistor P1 and the driver transistor N2 are located on opposite sides of the storage capacitor Cst, for example, on opposite sides of the storage capacitor Cst in the first direction D1. The driver transistor N2, the noise reduction transistor N4, the bias transistor N5 and the resistor 130 are located on the same side of the storage capacitor Cst. Specifically, the first data writing transistor N1 and the second data writing transistor P1 are located on one side of the storage capacitor Cst, such as the upper side of the storage capacitor Cst in FIG. 4B, whereas the driver transistor N2, the noise reduction transistor N4, the bias transistor N5 and the resistor 130 are located on the other side of the storage capacitor Cst, such as the lower side of the storage capacitor Cst in FIG. 4B.

In some embodiments, the storage transistor N3 serves as the storage capacitor Cst, and the storage transistor N3 includes the gate N3G, the first electrode N3D, the second electrode N3S, and the active region N3a located between the first electrode and the second electrode, where the gate N3G of the storage transistor N3 serves as the first capacitor electrode 141 of the storage capacitor Cst, the first electrode N3D and the second electrode N3S of the storage transistor N3 are electrically connected, and the first electrode, the second electrode and the active region N3a of the storage transistor N3 serve as the second capacitor electrode 142 of the storage capacitor together. Specifically, the first electrode N3D, the active region N3a and the second electrode N3S of the storage transistor N3 serve as the first region, the second region and the third region of the second capacitor electrode 142, respectively, where the first region and the second region have the same carrier mobility, which is different from the carrier mobility of the third region. As shown in FIG. 4B, the first region, the second region, and the third region of the second capacitor electrode 142 are sequentially arranged along a short side direction of the sub-pixel, that is, the second direction D2, the first region and the second region have the same carrier mobility, which is different from the carrier mobility of the third region, and an area of the second region is greater than an area of the first region and an area of the third region.

A material of the active region N3a of the memory transistor N3 is a semiconductor material. In some embodiments, the base substrate 101 is a P-type silicon-based substrate, and the material of the base substrate 101 is, for example, P-type single crystal silicon. The active region N3a of the memory transistor N3 is formed by performing N-type light doping on the P-type silicon-based substrate, where the N-type doping process may be, for example, an ion implantation process, and the doped element may be, for example, boron. When a voltage is applied to the first capacitor electrode 141, the active region N3a of the storage transistor N3 becomes a conductor, so that the first electrode N3D, the second electrode N3S and the active region N3a of the storage transistor N3 form a conductor structure, which serves as the second capacitor electrode 142 of the storage capacitor Cst.

In some embodiments, as shown in FIG. 4B, in the first direction D1 parallel to the base substrate, the resistor 130 and the driver transistor N2 are located on the same side of the storage capacitor Cst. It may be seen from FIGS. 2B and 2C that the second electrode N2S of the driver transistor N2 is connected to the first electrode 121 of the light emitting device 120, for example, the anode, through the resistor 130. As such, the resistor 130 and the driver transistor N2 are located on the same side of the storage capacitor Cst, so that a distance between the resistor R and the driver transistor N2, especially a distance between the first terminal 131 of the resistor 130 and the second electrode N2S of the driver transistor N2, may be minimized, thereby reducing a size of a wire connected between the first terminal of the resistor R and the second electrode N2S of the driver transistor N2.

In some embodiments, as shown in FIG. 4B, in the second direction D2, the driver transistor N2, the noise reduction transistor N4, and the bias transistor N5 are arranged in sequence. The second electrode N2S of the driver transistor N2 and the first electrode N4D of the noise reduction transistor N4 have an integrated structure, and the second electrode N4S of the noise reduction transistor N4 and the first electrode N5D of the bias transistor N5 have an integrated structure.

In some embodiments, the resistor 130 is between the storage capacitor Cst and a combination of the driver transistor N2, the noise reduction transistor N4, and the bias transistor N5. The resistor 130 includes a plurality of first sub-segments in the first direction and a plurality of second sub-segments in the second direction, and the plurality of first sub-segments and the plurality of second sub-segments are connected end to end to form a bended structure. The resistor 130 thus arranged has a greater length, which may ensure that the resistor 130 has a greater resistance value. The first terminal 131 and the second terminal 132 of the resistor 130 are provided with contact hole regions described later. Specifically, the first terminal 131 of the resistor 130 is provided with a contact hole region for electrical connection with the first node S, that is, for electrically connecting with the second electrode N2S of the driver transistor N2 and the first electrode N4D of the noise reduction transistor N4. In some embodiments, as shown in FIG. 4B, the first terminal 131 of the resistor 130 and the gate N4G of the noise reduction transistor N4 are an integrated structure. The second terminal 132 of the resistor 130 is provided with a contact hole region for electrical connection with the first electrode 121 of the light-emitting element 120.

In some embodiments, as shown in FIG. 4B, the transmission gate circuit includes a first data writing transistor N1 and a second data writing transistor P1, where the second data writing transistor P1 and the first data writing transistor N1 are arranged side by side in the second direction D2 and are symmetrical relative to a symmetry axis along the first direction D1. Specifically, the gate N1G of the first data writing transistor N1 and the gate P1G of the second data writing transistor P1 are arranged side by side in the second direction D2 and are symmetrical relative to the symmetry axis along the first direction D1; the first electrode N1D of the first data writing transistor N1 and the first electrode P1D of the second data writing transistor P1 are arranged side by side in the second direction D2 and are symmetrical relative to the symmetry axis along the first direction D1; the second electrode N1S of the first data writing transistor N1 and the second electrode P1S of the second data writing transistor P1 are arranged side by side in the second direction D2 and are symmetrical relative to the symmetry axis along the first direction D1; and the active region N1a of the first data writing transistor N1 and the active region P1a of the second data writing transistor P1 are arranged side by side in the second direction D2 and are symmetrical relative to the symmetry axis along the first direction D1.

In some embodiments, the first capacitor electrode 141 of the storage capacitor Cst, i.e., the gate N3G of the storage transistor N3, and gates of the transistors P1, N2, N3, N4, and N5 are each arranged in the same layer as the resistor 130, and they all include polysilicon material. The polysilicon material is doped to form the first capacitor electrode 141 of the storage capacitor Cst, a gate of each transistor and the resistor 130. Doping concentrations of the first capacitor electrode 141 of the storage capacitor Cst and the gate of each transistor are higher than a doping concentration of the resistor 130, which makes the conductivity of the resistor 130 lower than conductivity of the first capacitor electrode 141 of the storage capacitor Cst and the gate of each transistor, that is, the resistivity of the resistor 130 is higher than resistivity of the first capacitor electrode 141 of the storage capacitor Cst and the gate of each transistor. In some embodiments, a main part of the resistor 130 connected between the first terminal 131 and the second terminal 132 of the resistor 130 may not be doped or have a lower doping concentration.

In some embodiments, as shown in FIG. 4B, a shortest distance between the driver transistor N2 and the first data writing transistor N1 is greater than a shortest distance between the driver transistor N2 and the second data writing transistor P1.

In some embodiments, as shown in FIG. 4B, a shortest distance between the bias transistor N5 and the first data writing transistor N1 is less than a shortest distance between the bias transistor N5 and the second data writing transistor P1.

As used herein, a shortest distance between two parts refers to a distance between a point on one part and a point on the other part which is the smallest among all the point-to-point distances between the two parts.

In some embodiments, as shown in FIG. 4B, a width of the resistor is less than a width of any one of the gate N1G of the first data writing transistor N1, the gate P1G of the second data writing transistor P1, the gate N2G of the driver transistor N2, the gate N4G of the noise reduction transistor N4 and the gate N5G of the bias transistor N5, where the gate N1G of the first data writing transistor N1, the gate P1G of the second data writing transistor P1, the gate N2G of the driver transistor N2, and the gate N4G of the noise reduction transistor N4 extend in the first direction D1.

In some embodiments, each of the gates P1G, N1G, N2G, and N3G of the transistors P1 and N1 to N3 is arranged in the same layer, includes the polysilicon material, and is formed through the same doping process. In some embodiments, as shown in FIG. 4B, the gate N4G of the noise reduction transistor N4 and the first terminal 131 of the resistor 130 are connected to each other as a continuous structure.

In some embodiments, as shown in FIG. 4B, the sub-pixel includes a first region 401 and a second region 402, where the second region 402 is an N-type well region formed by performing N-type heavy doping on the P-type base substrate 101, and the first region 401 is a remaining region of the sub-pixel 100 other than the N-type well region. The second data writing transistor P2 is formed in the second region 402. The first data writing transistor N1, the driver transistor N2, the storage capacitor Cst, the noise reduction transistor N4, the bias transistor N5 and the resistor 130 are all formed in the first region 401.

In some embodiments, FIG. 4B further shows the active regions P1a, N1a, N2a, N3a, N4a and N5a of the respective transistor P1 and N1 to N5. The active regions N1a, N2a, N3a, N4a and N5a of the first data writing transistor N1, the driver transistor N2, the storage transistor N3, the noise reduction transistor N4 and the bias transistor N5 are each formed by performing an N-type light doping process on the P-type substrate 101, and may be formed simultaneously through the same doping process. The active region P1a of the second data writing transistor P1 is formed in the second region 402 by using a P-type light doping process.

As shown in FIG. 4B, an area of the active region N2a of the driver transistor N2 is larger than an area of the active region N1a of the first data writing transistor N1 and the active region P1a of the second data writing transistor P1. As such, a greater aspect ratio may be obtained, which helps to improve the driving capability of the driver transistor N2, thereby improving the display quality.

As shown in FIG. 4B, an area of the active region N3a of the storage transistor N3 is significantly larger than areas of active regions of other transistors, so that when the storage transistor N3 serves as the storage capacitor Cst, a capacitance value of the storage capacitor in the sub-pixel may be ensured, and thus the display quality is ensured.

In some embodiments, each of the first electrodes P1D, N1D, N2D, N3D, N4D and N5D, and the second electrodes P1S, N1S, N2S, N3S, N4S and N5S of the transistors P1 and N1 to N5 is formed by performing a heavy doping process on a part of a corresponding active region, for example, corresponding gates formed later are used as masks to perform the doping process. Specifically, each of the first electrodes P1D, N1D, N2D, N3D, N4D and N5D, and the second electrodes P1S, N1S, N2S, N3S, N4S and N5S of the first data writing transistor N1, the driver transistor N2, the storage transistor N3, the noise reduction transistor N4 and the bias transistor N5 is formed by performing an N-type heavy doping process in the first region 401, and they may be formed simultaneously through the same doping process. The first electrode P1D and the second electrode P1S of the second data writing transistor P1 are formed by performing a P-type heavy doping process in the second region 402.

FIG. 4B further shows connecting via holes in the second insulating layer 202, which are used for electrically connecting components in a first metal layer to be formed with contact regions of the transistors and other components.

As shown in FIG. 4B, for a transistor with a large active region, such as the driver transistor N2, since there is enough space, the first electrode thereof may be provided with at least two contact regions electrically connected to the components in the first metal layer to be formed through two via holes, so that sufficient contact may be obtained with a structure to be connected and a parallel structure may be formed, thereby reducing contact resistance.

In some embodiments, FIG. 4B further shows contact hole regions 411, 400a and 400b. The contact hole region 411 is located in the second area 402, and is configured to be electrically connected to the first power supply voltage VDD to perform high voltage bias on an N-type substrate where the second data writing transistor P1 is located. The contact hole regions 400a and 400b are located in the first area 401, and are located on both sides of the storage capacitor Cst in the first direction D1, respectively. The contact hole regions 400a and 400b are both configured to be electrically connected to the ground voltage GND to perform low voltage bias on the P-type substrate where the transistors N1 to N5 are located. The contact hole regions 400a and 400b are formed through a P-type heavy doping process, which may be formed synchronously with the first electrode and the second electrode of the P-type transistor.

In some embodiments, as shown in FIG. 4B, the contact hole region 400a basically has a structure surrounding a combination of the driver transistor N2, the noise reduction transistor N4, the bias transistor N5 and the resistor 130, separating the combination of the driver transistor N2, the noise reduction transistor N4, the bias transistor N5 and the resistor 130 from the storage capacitor Cst.

Specifically, in some embodiments, the contact hole region 400a is an isolation structure and thus may also be referred to as an isolation structure 400a, and is coupled to the second electrode N5S of the bias transistor N5. An orthographic projection of at least one of the resistor 130, the driver transistor N2, the bias transistor N5 and the noise reduction transistor N4 on the base substrate 101 is surrounded by an orthographic projection of the isolation structure 400a on the base substrate 101.

Figure 6A:
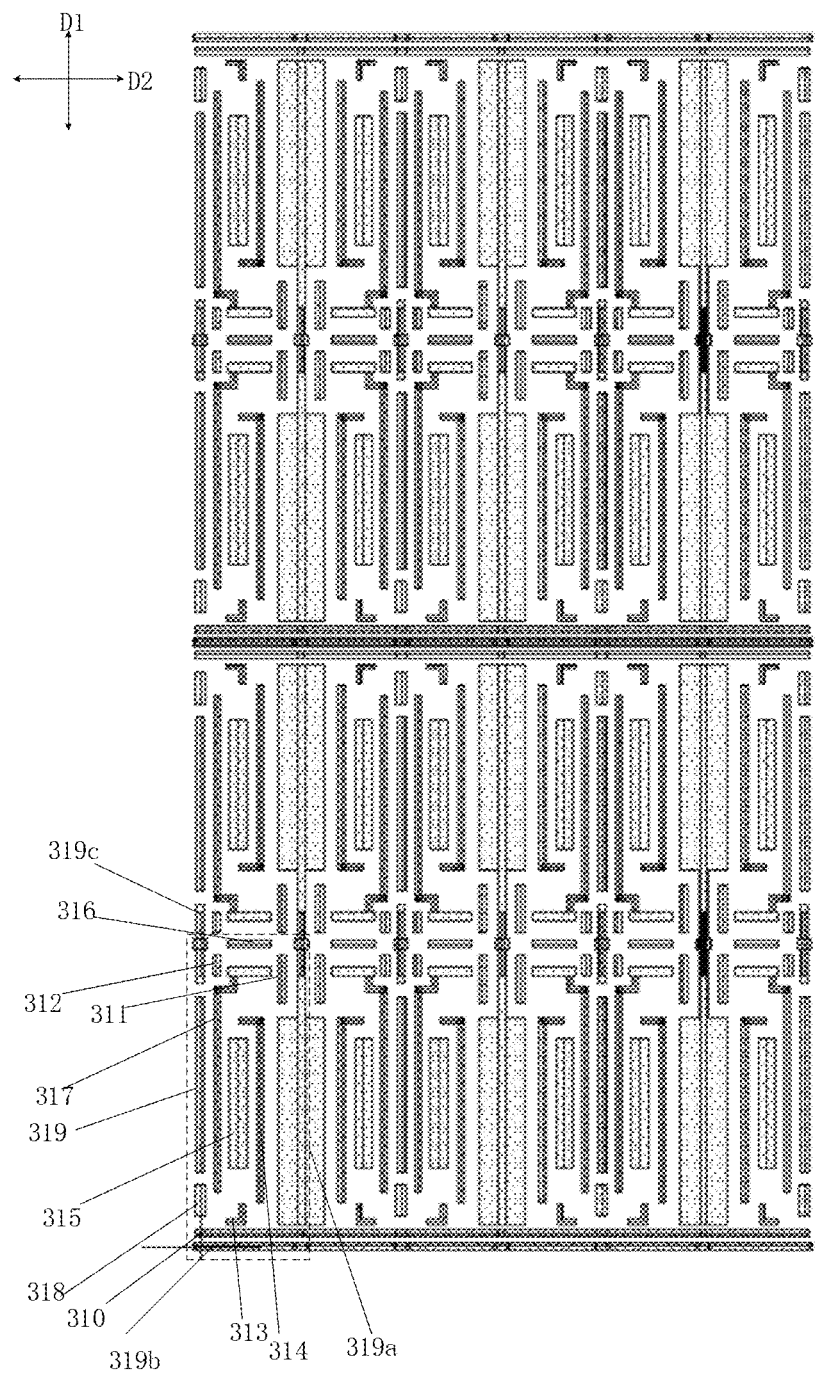
FIGS. 6A to 6C are schematic diagrams of a first conductive layer of a display panel provided by some embodiments of the present disclosure.
Figure 6B:
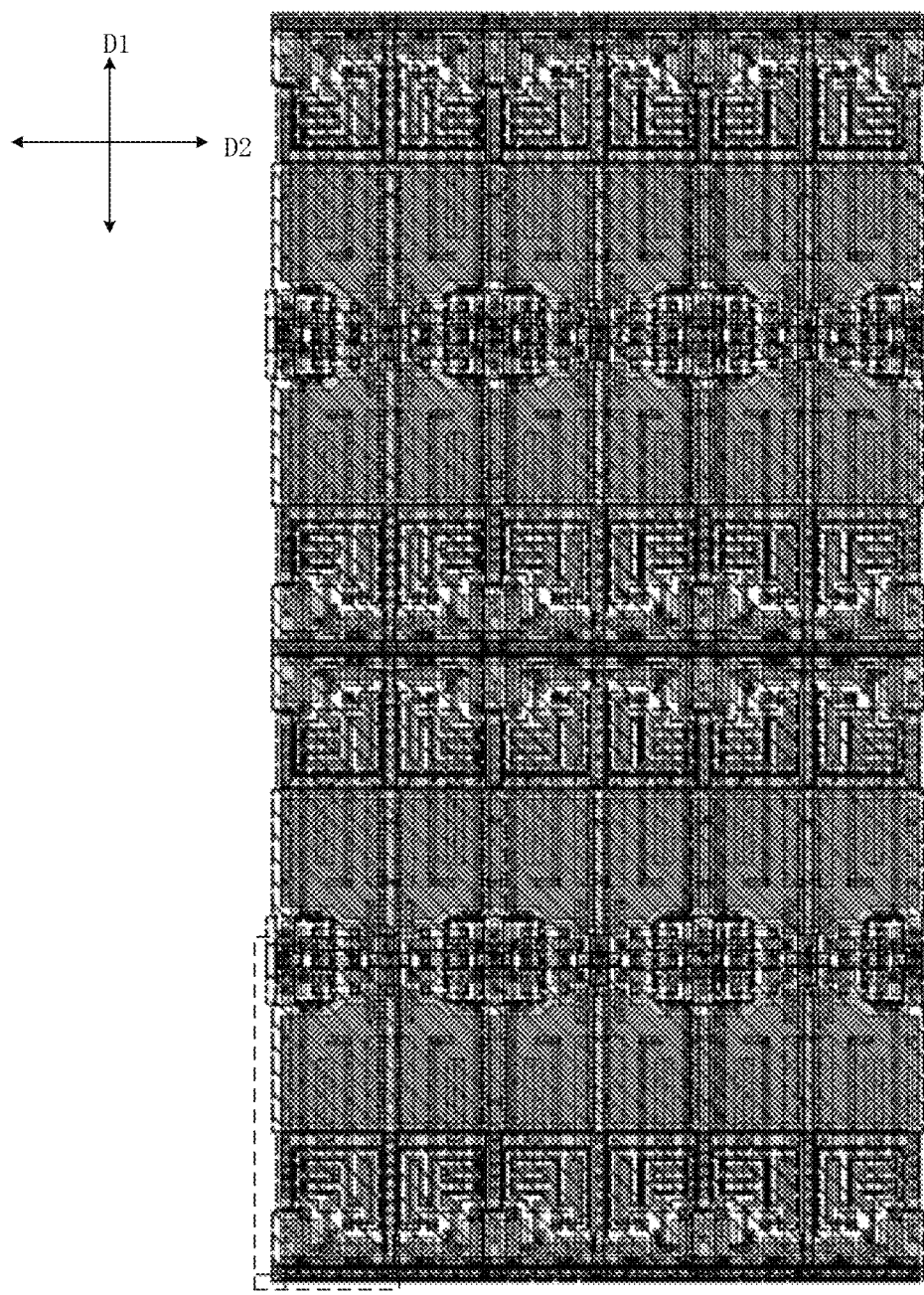
Figure 6C:
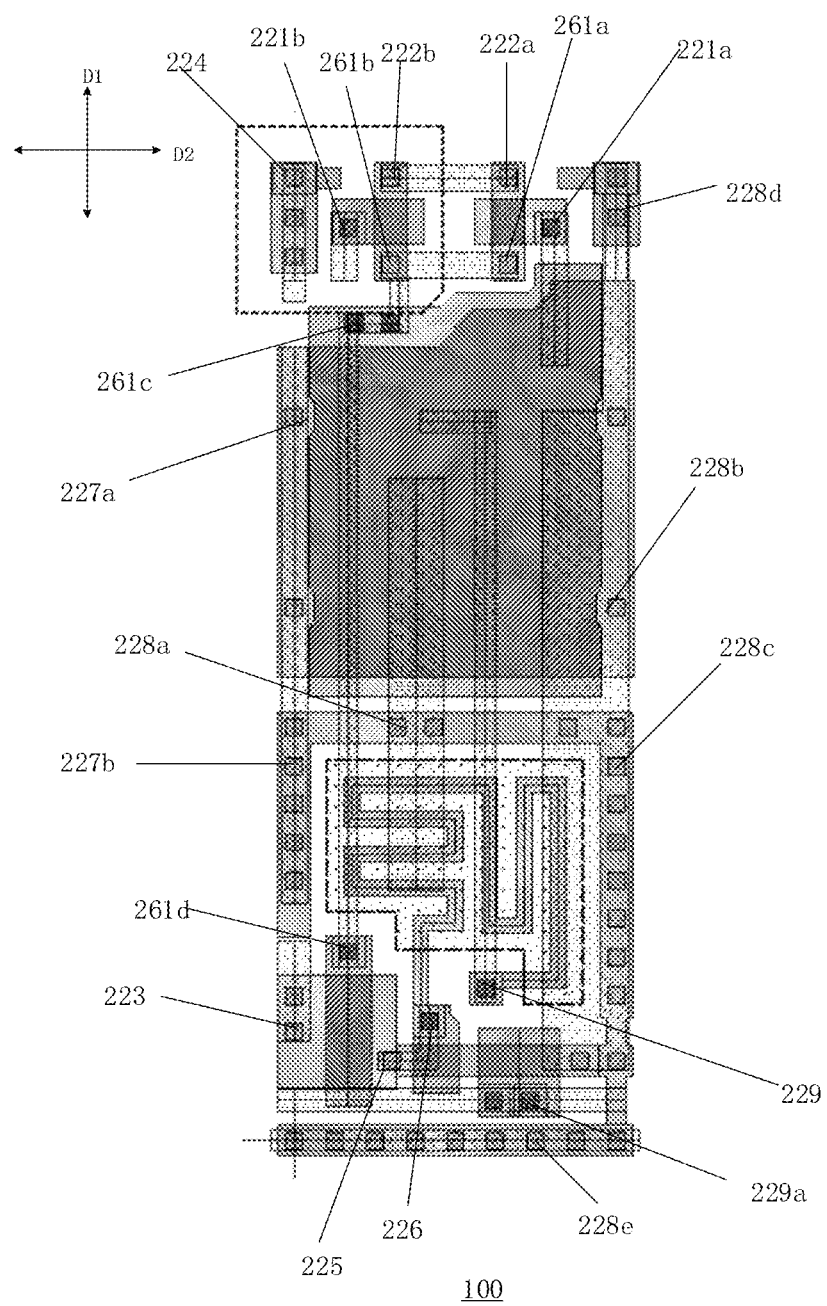

In some embodiments, in conjunction with FIG. 4B and subsequent FIG. 6C, the isolation structure 400a is coupled to the first conductive layer 301 through a plurality of via holes. In a case where space is enough, by providing more via holes, the isolation structure (the contact hole region) 400a is connected to a more stable ground voltage GND, which makes good electrical isolation between the storage capacitor Cst and the resistor 130, and good electrical isolation between adjacent sub-pixels at the same time. The via holes described here include a via hole 228a, a via hole 228c, a via hole 228e, and a via hole 227b in FIG. 6C, and a distribution density of the via holes on a side of the isolation structure 400a approximate to the noise reduction transistor N4 is greater than a distribution density of the via holes on a side of the isolation structure 400a approximate to the storage capacitor Cst.

In some embodiments, as shown in FIG. 4B, the isolation structure 400a is an open-loop structure with an opening, the first electrode N2D of the driver transistor N2 is located at the opening. Specifically, the isolation structure 400a has a substantially rectangular open-loop structure.

In some embodiments, as shown in FIG. 4B, the width of the gate N5G of the bias transistor N5 is greater than the width of the gate N2G of the drive transistor N2.

In some embodiments, as shown in FIG. 4B, a shortest distance between the gate N4G of the noise reduction transistor N4 and the isolation structure 400a is greater than a shortest distance between the gate N2G of the driver transistor N2 and the isolation structure 400a, which may reduce noise better.

In some embodiments, as shown in FIG. 4B, a total length of the resistor 130 is greater than a total length of the isolation structure 400a.

With reference to FIG. 4A, two adjacent sub-pixels 100 in the first direction D1 are symmetrical relative to the symmetry axis along the second direction D2, and two adjacent sub-pixels 100 in the second direction D2 are symmetrical relative to the symmetry axis along the first direction D1. Specifically, distributions of respective transistors (for example, including a shape, a size and the like of each transistor), storage capacitors and resistors in the two adjacent sub-pixels 100 in the first direction D1 are symmetrical relative to the symmetry axis along the second direction D2, that is, corresponding structures in the two sub-pixels are respectively symmetrical relative to the symmetry axis along the second direction D2. Distributions of transistors, storage capacitors and resistors in the two adjacent sub-pixels 100 in the second direction D2 are symmetrical relative to the symmetry axis along the first direction D1.

This symmetrical arrangement may improve uniformity of process errors as much as possible, thereby improving uniformity of the display panel. In addition, such symmetrical arrangement allows some structures in the substrate that are arranged in the same layer and can be connected to each other to be integrally formed. Compared with a separate arrangement, the pixel layout may be made more compact and the utilization of space is improved, thereby increasing the resolution of the display panel.

In some embodiments, as shown in FIG. 4A, second areas 402 of the two adjacent sub-pixels 100 in the first direction D1 are formed as a continuous structure, and second areas 402 of the two adjacent sub-pixels 100 in the second direction D2 are formed as a continuous structure. That is, the second areas of these four adjacent sub-pixels 100 form an N-type well region 402N. Second data writing transistors P1 of the four adjacent sub-pixels 100 are located in the same N-type well region 402N. The four adjacent sub-pixels 100 constitute a pixel group 420. Compared with each sub-pixel being arranged in an independent N-type well region, such arrangement may make an arrangement of the pixels more compact on the premise of meeting design rules, which helps to improve the resolution of the display panel.

In some embodiments, as shown in FIG. 4A, the four adjacent sub-pixels 100 share the same contact hole region 411, where the contact hole region 411 is located in the middle of the N-type well region 402N of the pixel group 420, and appears as an axisymmetric figure, symmetrical relative to the symmetry axis along the first direction D1 and the symmetry axis along the second direction D2.

In some embodiments, as shown in FIGS. 4A and 4B, in the same pixel group 420, active regions P1a of second data writing transistors P1 of the two adjacent sub-pixels in the first direction D1 are connected to each other as a continuous structure, and the second data writing transistors P1 of the two adjacent sub-pixels share one second electrode P1S.

In some embodiments, as shown in FIGS. 4A and 4B, in the same pixel group 420, active regions N1a of first data writing transistors N1 of the two adjacent sub-pixels in the first direction D1 are connected to each other as a continuous structure, and the first data writing transistors N1 of the two adjacent sub-pixels share one second electrode N1S.

As shown in FIG. 4A, for the two adjacent sub-pixels 100 in the second direction D2, in a case where driver transistors N2 thereof are adjacent, the two adjacent sub-pixels are located in the same pixel group 420, first electrodes N2D of the two driver transistors N2 are connected to each other as a continuous structure, and the two driver transistors N2 share one first electrode N2D. Such arrangement may make the arrangement of the pixels more compact on the premise of meeting the design rules, which helps to improve the resolution of the display panel.

As shown in FIG. 4A, for the two adjacent sub-pixels 100 in the second direction D2, if the two sub-pixels are located in the same pixel group 420, storage transistors N3 of the two adjacent sub-pixels share one first electrode N3D; if the two sub-pixels are located in different pixel groups 420, the storage transistors N3 of the two adjacent sub-pixels share one second electrode N3S. Such arrangement may make the arrangement of the pixels more compact on the premise of meeting the design rules, which helps to improve the resolution of the display panel.

As shown in FIG. 4A, for the two adjacent sub-pixels 100 in the second direction D2, contact hole regions 400a of the two sub-pixels are formed as a continuous structure. For the two adjacent sub-pixels 100 in the first direction D1, when the two sub-pixels are located in different pixel groups 420, contact hole regions 400a of the two sub-pixels are formed as a continuous structure.

FIGS. 5A to 5I show a formation process of the substrate structure shown in FIG. 4A. As shown in FIG. 4A, the display panel includes a plurality of pixel unit groups 420 arranged in the first direction D1 and the second direction D2.

A formation process of the display panel provided by the embodiments of the present disclosure will be exemplarily described in conjunction with FIGS. 5A to 5H below, however, this is not a limitation on the present disclosure.

For example, a silicon-based base substrate 101 is provided, and for example, a material thereof is P-type single crystal silicon. An N-type transistor (such as a driver transistor) may be directly prepared on the P-type silicon substrate, that is, the P-type substrate is directly doped to form a channel region of the N-type transistor, which is conducive to taking advantage of the high speed of the NMOS device, and performance of the circuit is improved.

Figure 5A:
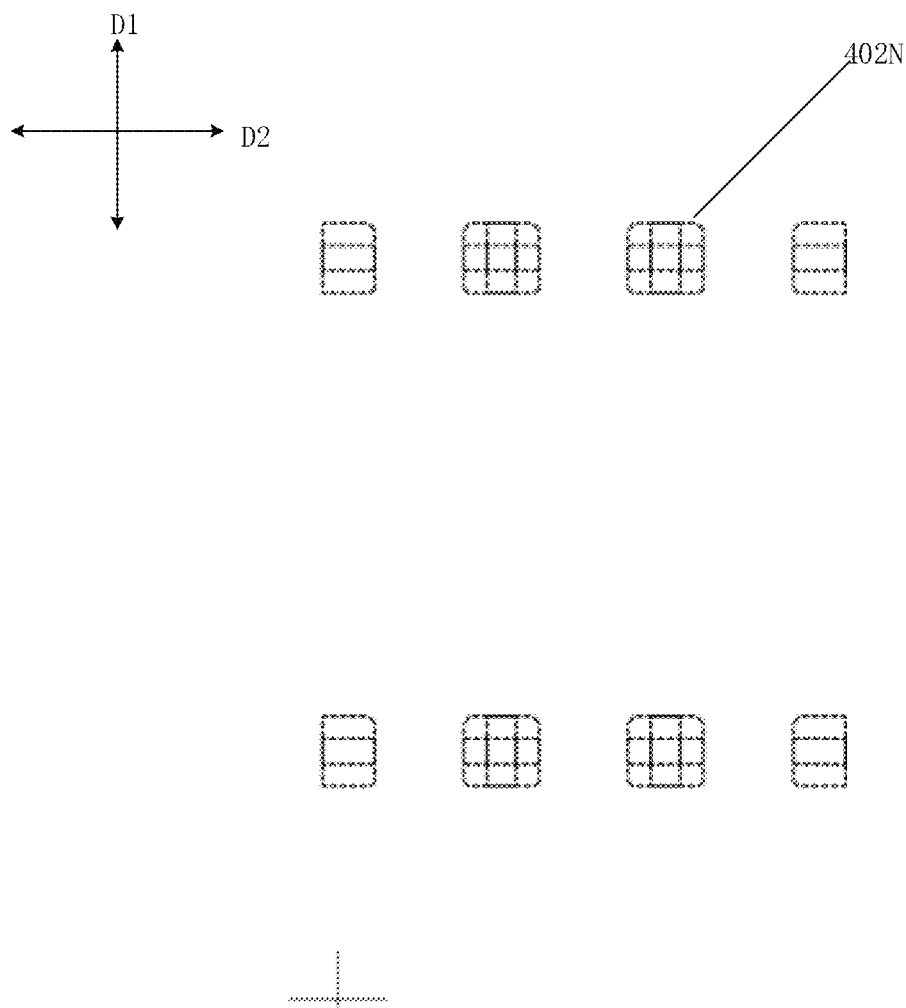
FIGS. 5A to 5I are diagrams showing steps of manufacturing the display panel shown in FIG. 4A.

FIG. 5A shows an N-type well region formed on the base substrate. As shown in FIG. 5A, in some embodiments, N-type heavy doping is performed on the P-type silicon substrate to form an N-type well region 402N including the second region 402 of the sub-pixel, to serve as a substrate of the second data writing transistor P1.

In some embodiments, the second areas 402 of the two adjacent sub-pixels in the first direction D1 may be connected to each other, and the second regions 402 of the two adjacent sub-pixels in the second direction D2 may be connected to each other. For example, second areas 402 of four sub-pixels in a pixel group 420 are connected as a continuous structure to form an N-type well region 402N of the pixel group 420. FIG. 5A shows N-type well regions of two rows and three columns of pixel groups (corresponding to four rows and six columns of sub-pixels). In some embodiments, a non-doped area of the base substrate 101 is shielded when the N-type doping is performed to form the N-type well region.

Figure 5B:
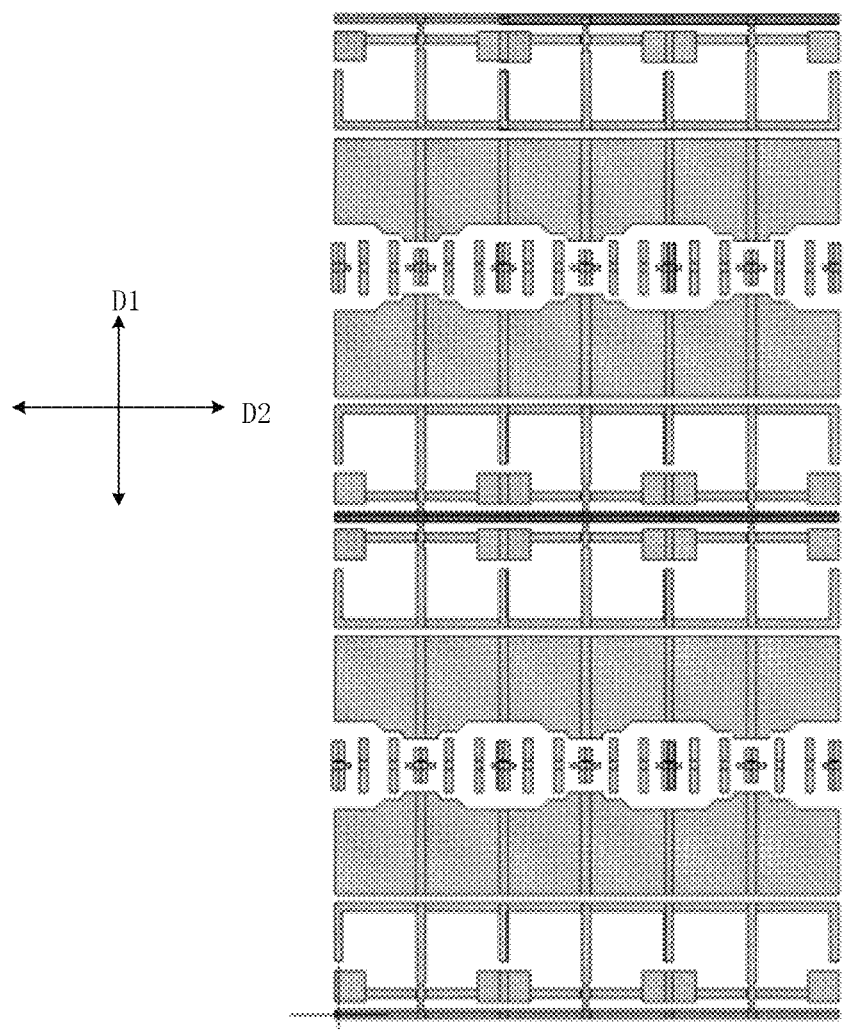
Figure 5C:
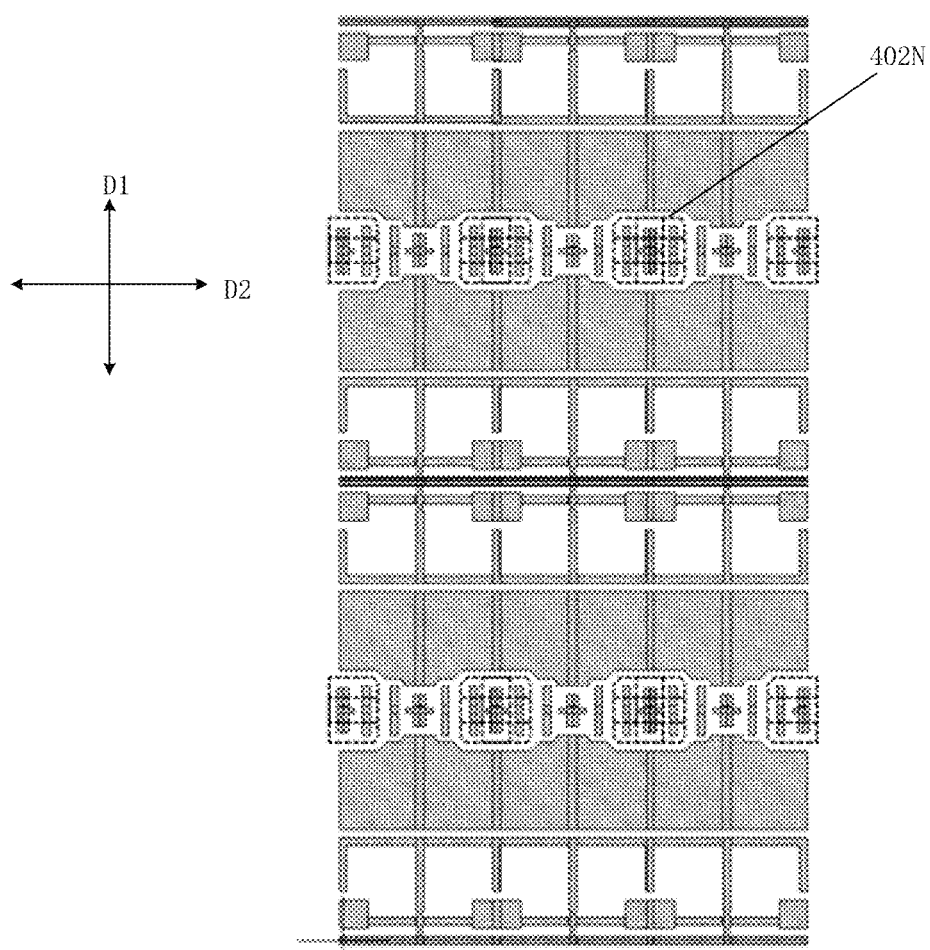

FIG. 5B shows active region patterns of the base substrate, and the lower diagram in FIG. 5C shows active region patterns formed on the substrate structure shown in FIG. 5A. The active region patterns may be obtained by performing light doping on the base substrate. Specifically, in the N-type well region, an active region pattern of the second data writing transistor P1 is formed in the N-type well region by performing P-type light doping, and the active region pattern is configured to be subsequently used for forming the first electrode P1D and the second electrode P1S of the second data writing transistor P1, and the active region P1a that serves as a channel Outside the N-type crystal well region, active region patterns of the first data writing transistor N1, the driver transistor N2, the storage transistor N3, the noise reduction transistor N4 and the bias transistor N5 are formed by performing N-type light doping, and the active region patterns of the first data writing transistor N1, the driver transistor N2, the storage transistor N3, the noise reduction transistor N4 and the bias transistor N5 are respectively configured to be subsequently used for forming the first electrodes N1D, N2D, N3D, N4D and N5D and the second electrodes N1S, N2S, N3S, N4D and N5D of the first data writing transistor N1, the driver transistor N2, the storage transistor N3, the noise reduction transistor N4 and the bias transistor N5, and the active regions N1a, N2a, N3a, N4a and N5a that serve as channels.

During a process of doping, the N-type doping and the P-type doping need to be performed separately. When performing an N-type doping process, it is necessary to form a barrier layer to shield a region that is not N-type-doped; when performing a P-type doping process, it is necessary to form a barrier layer to shield a region that is not P-doped.

Figure 5D:
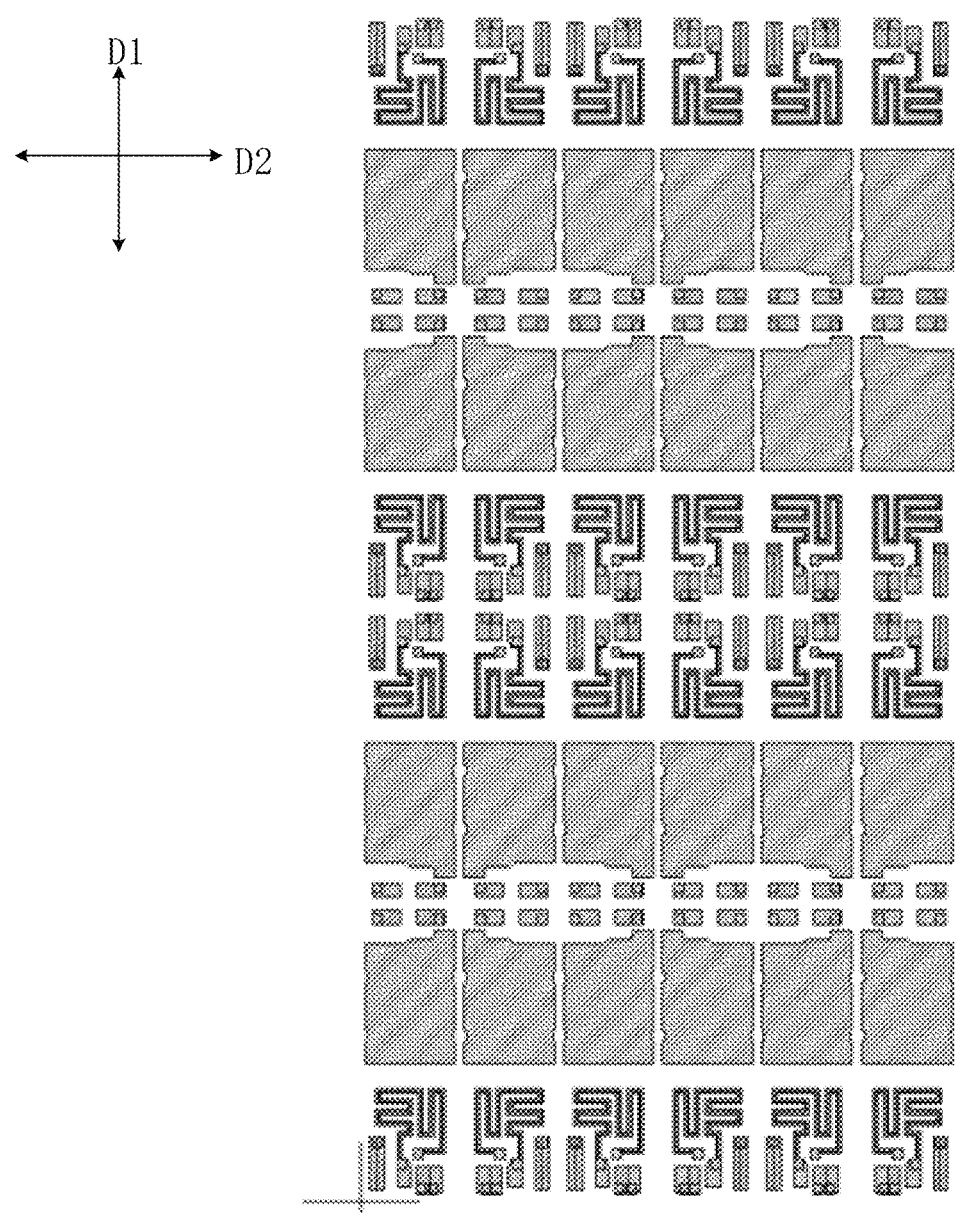
Figure 5E:
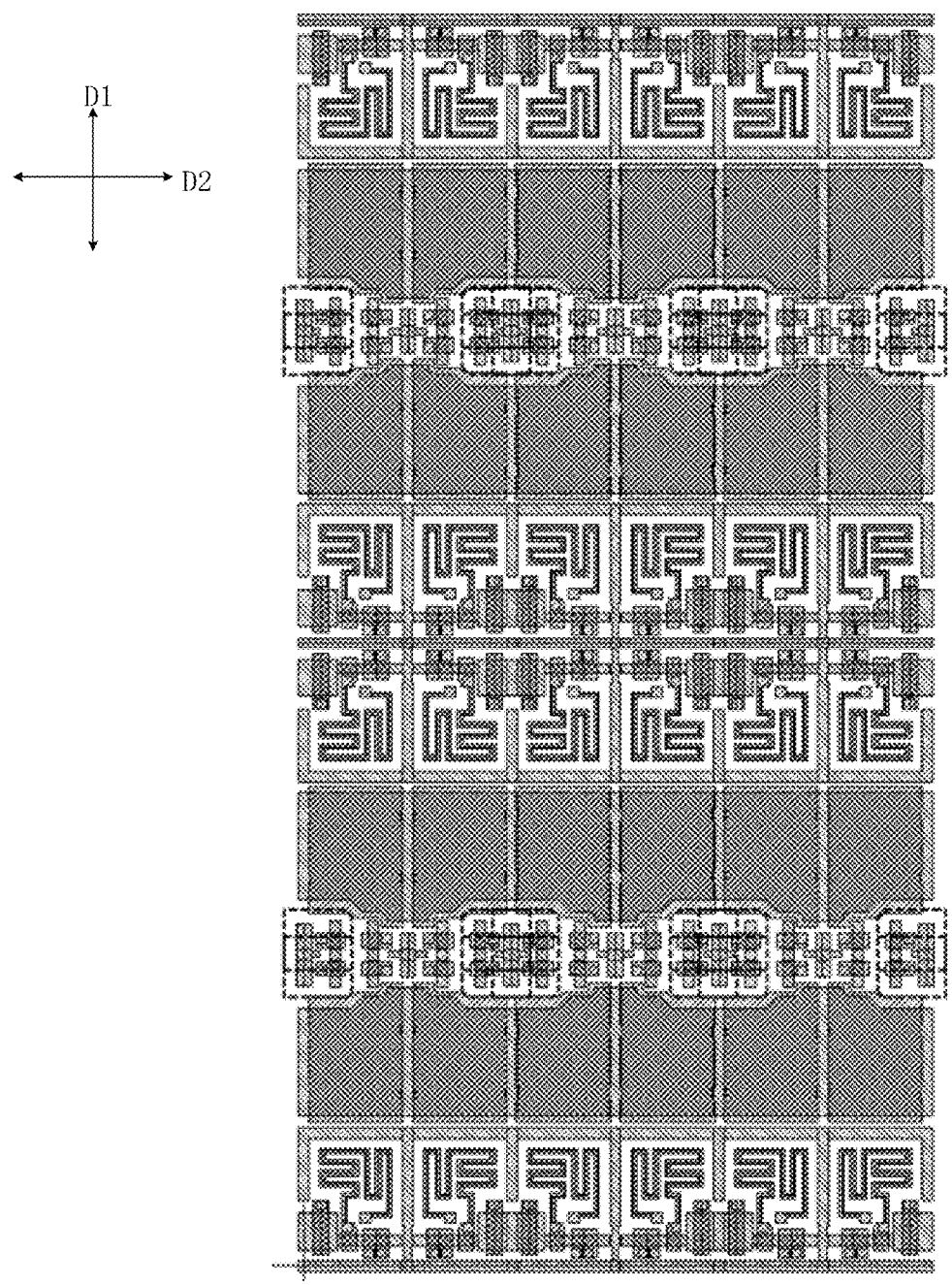

FIG. 5D shows patterns of a polysilicon layer on the base substrate, and the lower diagram in FIG. 5E shows patterns of a polysilicon layer formed on the substrate structure shown in FIG. 5C.

As shown in FIGS. 3B, 4B and 5E, in some embodiments, the first insulating layer 201 is formed on the base substrate 101, and then the polysilicon layer 102 is formed on the first insulating layer 201. Those skilled in the art can understand that, in order to clearly show relationships between the respective film layers, the transparent first insulating layer 201 is omitted in FIGS. 4B and 5E. In some embodiments, patterns of the first insulating layer 201 coincide with the patterns of the polysilicon layer 102.

The first insulating layer 201 includes a gate insulating layer of each transistor, and further includes a dielectric layer 104 of the storage capacitor Cst. The polysilicon layer 102 is configured to form the first capacitor electrode 141, the gate N3G of the memory transistor N3, the resistor 130, and the gates P1G, N1G, N2G, N4G and N5G of the respective transistors (P1, N1, N2, N4 and N5).

As shown in FIGS. 4B and 5E, the gate P1G of the second data writing transistor P1 is located in the second region 402. The gate N1G of the first data writing transistor N1, the gate N2G of the driver transistor N2, the gate N4G of the noise reduction transistor N4, the gate N5G of the bias transistor N5, the first capacitor electrode 141, and the resistor 130 are formed in the first area 401 outside the N-type well region 402N.

In some embodiments, as shown in FIGS. 4B and 5E, orthographic projections of first capacitor electrodes 141 of four sub-pixels in each pixel unit group on the base substrate are located outside an N-type well region formed by second areas 402 of the four sub-pixels, and surround the N-type well region. For example, the N-type well region is substantially rectangular, and an orthographic projection of a first capacitor electrode 141 of each sub-pixel on the base substrate surrounds a corner of the rectangle.

As shown in FIGS. 4B and 5E, patterns of the polysilicon layer in the two adjacent sub-pixels in the first direction D1 are symmetrical relative to the symmetry axis along the second direction D2; patterns of polysilicon layer in the two adjacent sub-pixels in the second direction D2 are symmetrical relative to the symmetry axis along the first direction D1, that is, the patterns of the polysilicon layer are symmetrical. In some embodiments, as shown in FIGS. 4B and 5E, resistors of adjacent sub-pixels in the first direction are symmetrical relative to the symmetry axis along the second direction, and resistors of adjacent sub-pixels in the second direction are symmetrical relative to the symmetry axis along the first direction. In some embodiments, first capacitor electrodes of the adjacent sub-pixels in the first direction are symmetrical relative to a symmetry axis along the second direction, and first capacitor electrodes of the adjacent sub-pixels in the second direction are symmetrical relative to the symmetry axis along the first direction.

In some embodiments, gates of the first data writing transistor N1 and the second data writing transistor P1 of the two adjacent sub-pixels in the second direction D2 are symmetrical relative to the symmetry axis along the first direction D1, respectively.

In some embodiments, the gates of the first data writing transistor N1 and the second data writing transistor P1 of the two adjacent sub-pixels in the first direction D1 are symmetrical relative to the symmetry axis along the second direction D2, respectively.

In some embodiments, the first insulating layer 201 is formed on the base substrate by using a thermal oxidation method. For example, a material of the first insulating layer is silicon nitride, oxide or oxynitride.

For example, a polysilicon material layer is formed on the first insulating layer through a chemical vapor deposition process (PVD), and then a photolithography process is performed on the polysilicon material layer to form the polysilicon layer 102.

Figure 5F:
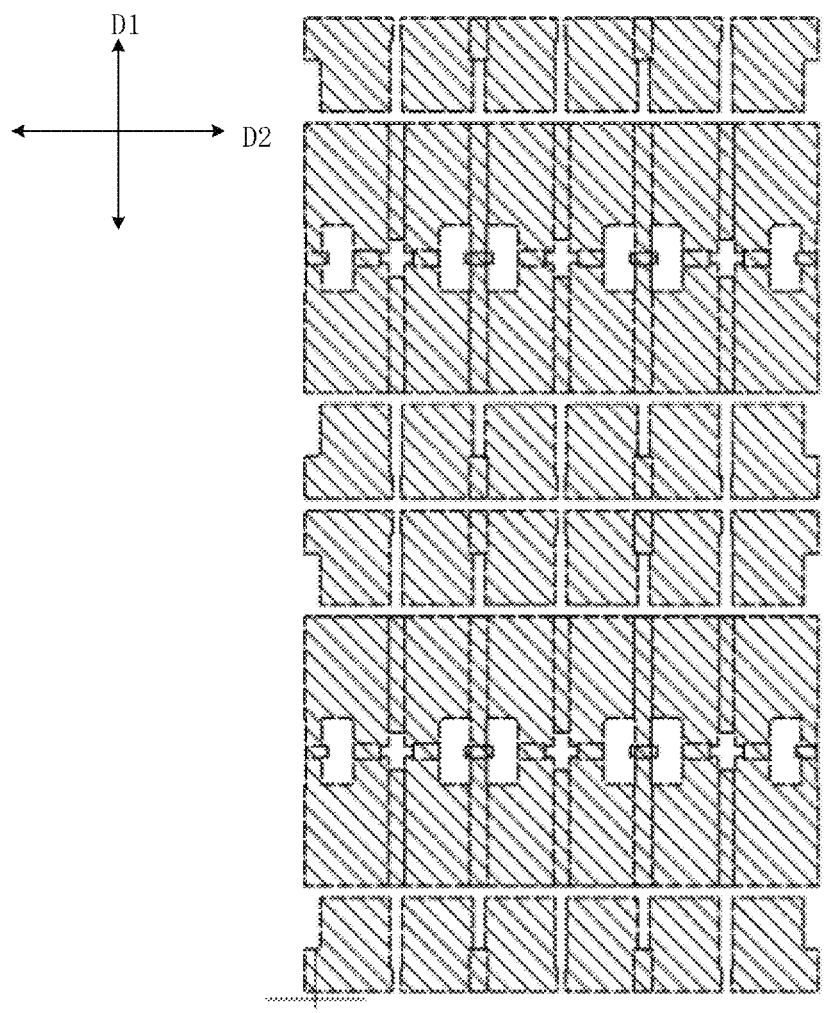
Figure 5G:
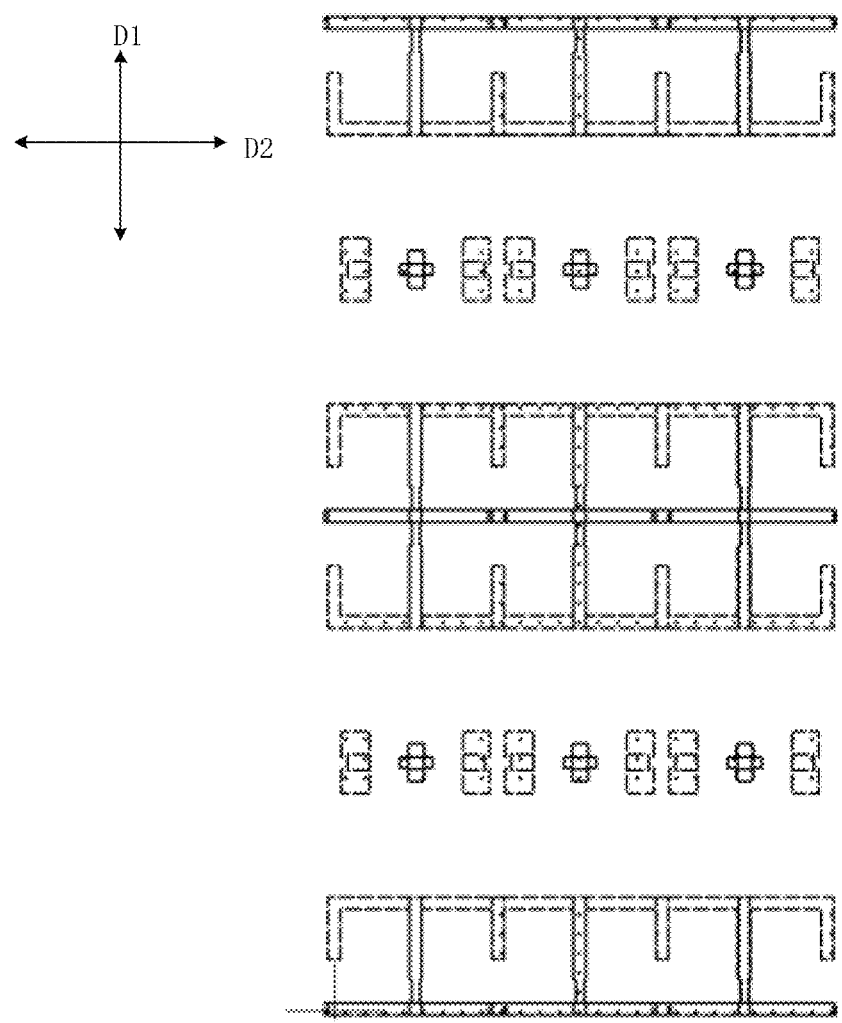
Figure 5H:
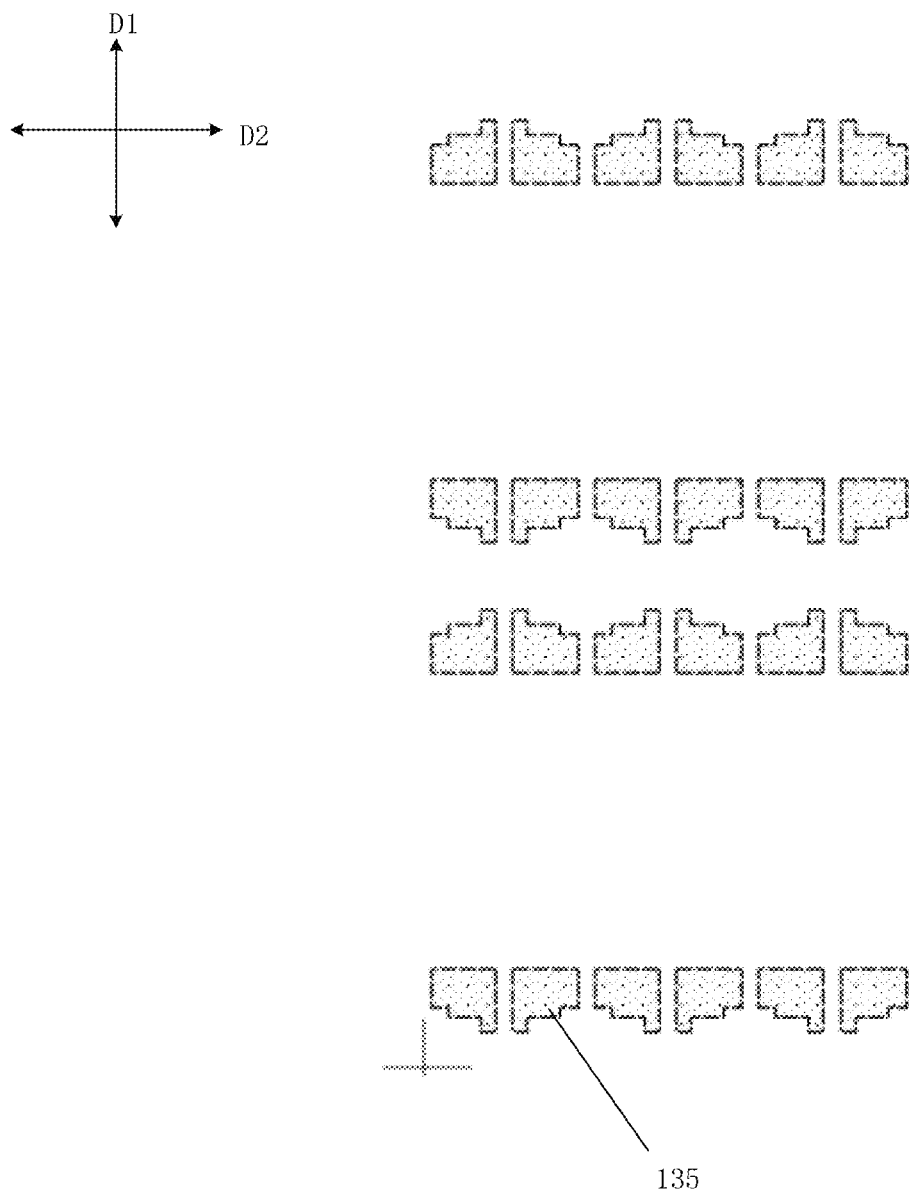
Figure 5I:
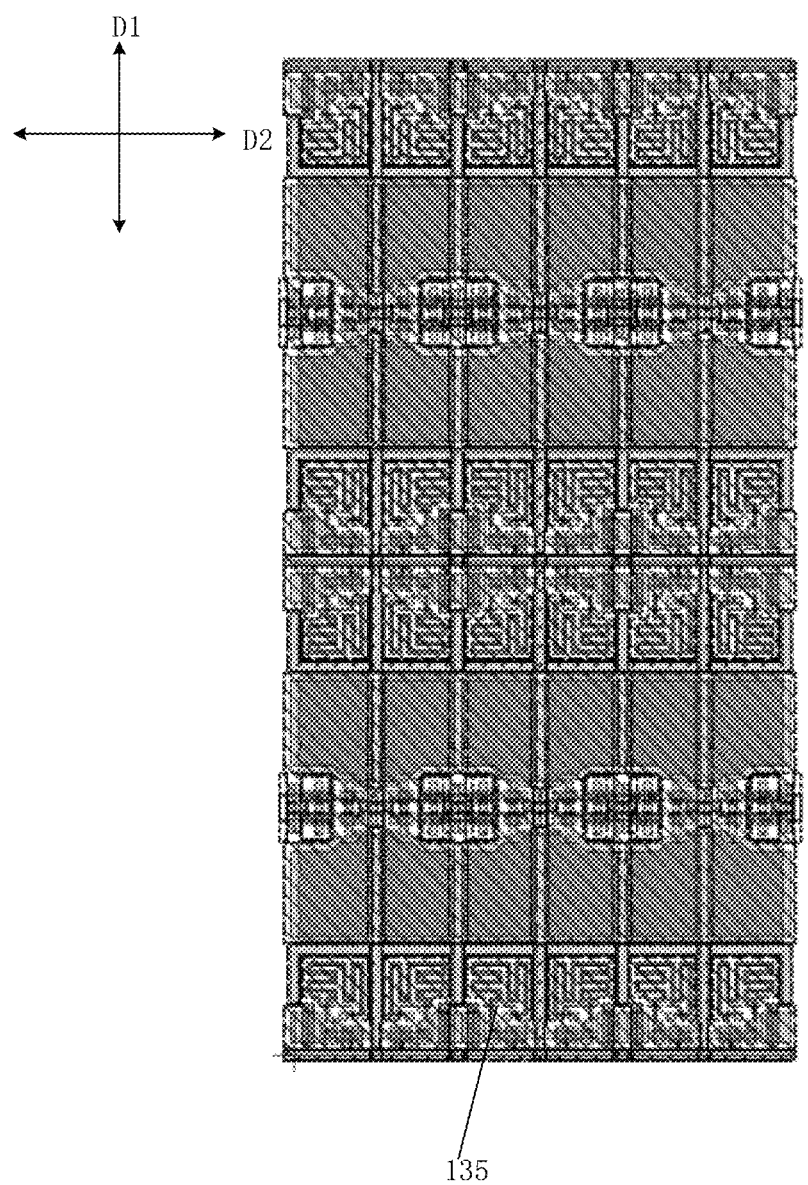

FIG. 5F shows an N-type heavy doping window region of the base substrate, FIG. 5G shows a P-type heavy doping window region of the base substrate, FIG. 5H shows a shielding pattern for the resistor when N-type heavy doping is performed, FIG. 5I shows a schematic diagram of a substrate structure after N-type heavy doping and P-type heavy doping are performed on the substrate structure shown in FIG. 5E, and dashed boxes are used for showing the shielding pattern for the resistor in FIG. 5H. In some embodiments, on the base substrate on which the polysilicon layer 102 is formed, the N-type heavy doping window region is used for performing the N-type heavy doping and the P-type heavy doping window region is used for performing the P-type heavy doping, so as to form the contact hole regions for electrical connection. For example, the doping window region includes a source region and a drain region of each transistor, thereby forming a first electrode of each transistor, such as the drain, and the second electrode, such as the source. In some embodiments, the doping window region further includes contact hole regions of the substrate and contact hole regions of the resistor 130, such as the contact hole regions 400a, 400b and 411 shown in FIG. 4B. In some embodiments, since the gate of the transistor is made of polysilicon material, the polysilicon gate also needs to be doped. When the doping process is performed, a barrier layer may be formed as needed to cover the non-doped area, with only a corresponding doping window region exposed.

It should be noted that, FIGS. 5F and 5G only illustrate each doping window region. When the doping process is actually performed, a corresponding barrier layer/mask layer is then provided to expose the corresponding doping window region and polysilicon region for doping. For example, a material of the barrier layer/mask layer may be photoresist or oxide material.

In some embodiments, when N-type heavy doping is performed, as shown in FIGS. 5I and 5H, a barrier layer 135 corresponding to the resistor 130, i.e., the shielding pattern is formed. In order to ensure the resistance value of the resistor 130, the resistor 130 needs to be shielded during the N-type doping process to prevent the resistor 130 from being damaged due to the doping. The barrier layer 135 shields a main body of the resistor 130 and only exposes contact hole regions at both terminals of the resistor 130.

In some embodiments, the barrier layer 135 may be made of silicon nitride, oxide or oxynitride, it may also be made of a photoresist material. After the doping process is finished, the barrier layer 135 may remain in the display panel or may be removed.

In some embodiments, the barrier layer 135 of the resistor 130 may also be formed together with a barrier layer/mask layer in other region during doping, which is not limited in the embodiments of the present disclosure.

In some embodiments, during the doping process, the N-type heavy doping and P-type heavy doping need to be performed separately, for example, a source region and a drain region of an N-type transistor and a source region and a drain region of a P-type transistor are formed separately. When the N-type heavy doping process is performed, a barrier layer may be formed to shield a region that is not heavily N-type-doped; when the P-type heavy doping process is performed, a barrier layer may be formed to shield a region that is not heavily P-type-doped.

In some embodiments, referring to FIG. 4B, the gates, the first electrodes and the second electrodes of the transistors N1 to N5, and the contact hole region 411 may be formed through the N-type heavy doping process. The N-type doping process may be, for example, an ion implantation process, and the doping element may be, for example, boron. The gate, the first electrode and the second electrode of the transistor P1, and the contact hole regions 400a and 400b may be formed through the P-type heavy doping process. The P-type doping process may be, for example, an ion implantation process, and the doping element may be, for example, phosphorus.

In the above-mentioned doping process, for example, the ion implantation process is used, a polysilicon pattern may serve as a mask, so that ions are implanted into the silicon-based substrate on both sides of the polysilicon, thereby forming a first electrode and a second electrode of each transistor, and achieving self-alignment. In addition, resistivity of the polysilicon with higher resistance is reduced through the doping process, and a gate of each transistor and the first capacitor electrode may be formed. Therefore, that the polysilicon material is used as materials of the resistor and the gates has many beneficial effects and saves process costs.

In this way, the structure of the display panel shown in FIG. 4A is formed, including the transistors P1, N1, N2, N4 and N5, the resistor 130, and the storage capacitor Cst.

In some embodiments, corresponding transistors, resistors, and storage capacitors Cst in the two adjacent sub-pixels in the first direction D1 are symmetrical relative to the symmetry axis along the second direction D2, respectively; corresponding transistors, resistors, and storage capacitors Cst in the two adjacent sub-pixels in the second direction D2 are symmetrical relative to the symmetry axis along the first direction D1, respectively.

It should be noted that, in the embodiments, the storage transistor T3 serves as the storage capacitor Cst. Specifically, the gate T3G of the storage transistor N3 serves as the first capacitor electrode 141, and the first electrode N3D, the second electrode N3S and the active region N3a therebetween serve as the second capacitor electrode 142. After a voltage is applied to the first capacitor electrode 141, a region under the first capacitor electrode 141 in the base substrate 101 generates inversion charges, so that the first electrode N3D, the second electrode N3S of the memory transistor N3 and the active region N3a therebetween are formed as a conductor structure.

The first conductive layer 301, the third insulating layer 203, a second conductive layer 302, a fourth insulating layer 204, a third conductive layer 303, a fifth insulating layer 205 and a fourth conductive layer 304 are sequentially formed on the substrate shown in FIG. 4A, so as to form the display panel shown in FIG. 3A.

FIGS. 6A and 6B respectively show patterns of the first conductive layer 301 and a situation where the first conductive layer 301 is arranged on the substrate structure shown in FIG. 4A. FIG. 6B further shows via holes in the second insulating layer 202, which are used for electrically connecting the transistors and contact hole regions with the patterns in the first conductive layer 301. For clarity, only four rows and six columns of sub-pixels are shown in the figure, and an area of a sub-pixel 100 is shown by a dashed box. FIG. 6C is an enlarged schematic diagram of the sub-pixel shown by the dashed frame in FIG. 6B.

As shown in FIG. 6A, patterns of the first conductive layer in the two adjacent sub-pixels in the first direction D1 are symmetrical relative to the symmetry axis along the second direction D2; patterns of the first conductive layer in the two adjacent sub-pixels in the second direction D2 are symmetrical relative to the symmetry axis along the first direction D1. The patterns of the first conductive layer will be exemplarily described below by taking one sub-pixel as an example.

As shown in FIG. 6A, the first conductive layer 301 includes a connecting electrode 313 for electrically connecting the first terminal 131 of the resistor 130 with the second terminal N2S of the driver transistor N2. As shown in FIG. 4B, the second electrode N2S of the driver transistor N2 and the first electrode N4D of the noise reduction transistor N4 are formed as a continuous structure. The first terminal 131 of the resistor 130 and the gate N4G of the noise reduction transistor N4 are formed as a continuous structure.

In some embodiments, referring to FIGS. 4B, 6B, and 6C in combination, the connecting electrode 313 is L-shaped as a whole, and includes a first part extending in the first direction D1, and a second part pointing from the first part to the driver transistor N2 in the second direction D2. A free end of the second part of the connecting electrode 313 is electrically connected to the second electrode N2S of the driver transistor N2 and the first electrode N4D of the noise reduction transistor N4, through a via hole 225 in the second insulating layer 202. The first part of the connecting electrode 313 is electrically connected to the first terminal 131 of the resistor 130 and the gate N4G of the noise reduction transistor N4 through a via hole 226 in the second insulating layer 202. The connecting electrode 313 may be regarded as the first node S.

In some embodiments, any one of the via hole 225 and the via hole 226 may be provided as one or more, to reduce contact resistance.

In some embodiments, referring to FIGS. 6A to 6C and 4B in combination, the first conductive layer 301 further includes a connecting electrode 314. The connecting electrode 314 is electrically connected to the second terminal 132 of the resistor 130 through a via hole 229 in the second insulating layer 202, and is used for electrically connecting to the first electrode 121 of the light-emitting element 120. For example, the connecting electrode 314 is L-shaped, a branch thereof extending in the first direction D1 is electrically connected to the second terminal 132 of the resistor 130, and the other branch extending in the second direction D2 is used for electrically connecting to the first electrode 121 of the light-emitting element 120.

In some embodiments, as shown in FIGS. 6A-6C and FIG. 4B, the first conductive layer 301 further includes a connecting electrode 315, which is bar-like and extends in the first direction D1 and is used for introducing the ground voltage GND into the contact hole region 400a. Specifically, the connecting electrode 315 is electrically connected to the contact hole region 400a through a via hole 228a in the second insulating layer 202.

In some embodiments, an orthographic projection of the connecting electrode 315 on the base substrate 101 and the orthographic projection of the first capacitor electrode 141 on the base substrate 101 partially overlap, and the connecting electrode 315 and the second capacitor electrode 142 of the storage capacitor Cst are both connected to the ground voltage GND. The connecting electrode 315 may serve as a third capacitor electrode of the storage capacitor Cst, so that the capacitance value of the storage capacitor Cst may be increased.

In some embodiments, the orthographic projection of the connecting electrode 315 on the base substrate 101 and an orthographic projection of the resistor 130 on the base substrate 101 partially overlap.

In some embodiments, the first conductive layer 301 further includes a connecting electrode 317 for electrically connecting the second terminal of the data writing sub-circuit and the first terminal of the storage sub-circuit, that is, the first electrode N1D of the first data writing transistor N1 and the first electrode P1G of the second data writing transistor P1 are electrically connected to the first capacitor electrode 141.

Referring to FIGS. 6A and 6B in combination, the connecting electrode 317 includes a first part extending in the second direction D2, a second part extending in the first direction D1, and a third part located between and connecting the first part and the second part, where the third part is a bended structure. A first end of the first part of the connecting electrode 317 is electrically connected to the first electrode N1D of the first data writing transistor N1 through a via hole 261a in the second insulating layer 202, and a second end of the first part of the connecting electrode 317 is electrically connected to the first electrode P1D of the second data writing transistor P1 through a via hole 261b in the second insulating layer 202. The third part of the connecting electrode 317 is electrically connected to the first capacitor electrode 141 through a via hole 261c in the second insulating layer 202. In some embodiments, the number of via holes 261c may be one or more, for example, as shown in FIG. 6C, it may be two, so as to reduce contact resistance. A free end of the third part of the connecting electrode 317 is electrically connected to the gate N2G of the driver transistor N2 through a via hole 261d in the second insulating layer 202. The third part of the connecting electrode 317 substantially crosses the resistor 130 and the storage capacitor Cst in the first direction D1.

Referring to FIGS. 6A to 6C in combination, the first conductive layer 301 further includes a first scanning line connecting portion 311 and a second scanning line connecting portion 312, where the first scanning line connecting portion 311 is used for electrically connecting to the first scanning line, so that the gate of the first data writing transistor N1 receives the first control signal SEL. The second scanning line connecting portion 312 is used for electrically connecting to the second scanning line, so that the gate of the second data writing transistor P1 receives the second control signal SEL_B.

In some embodiments, the first scanning line connecting portion 311 is electrically connected to the gate N1G of the first data writing transistor N1 through a via hole 221a in the second insulating layer 202, and the second scanning line connecting portion 312 is electrically connected to the gate P1G of the second data writing transistor P1 through a via 221b in the second insulating layer 202.

In some embodiments, as shown in FIGS. 6A to 6C, each of the first scanning line connecting portion 311 and the second scanning line connecting portion 312 is bar-like and extends in the first direction D1, and a length of the first scanning line connecting portion 311 is greater than a length of the second scanning line connecting portion 312.

As shown in FIG. 6A, the first conductive layer 301 further includes a data line connecting portion 316, which is used for electrically connecting to the data line, so that the second electrode N1S of the first data writing transistor N1 and the second electrode P1S of the second data writing transistor P1 receive the data signal transmitted by the data line.

As shown in FIGS. 6B and 6C, the data line connecting portion 316 is bar-like and extends in the second direction D2, a first end of the data line connecting portion 316 is electrically connected to the second electrode N1S of the first data writing transistor N1 through a via hole 222a in the second insulating layer 202, and a second end of the data line connecting portion 316 is electrically connected to the second electrode P1S of the second data writing transistor P1 through a via hole 222b in the second insulating layer 202.

In some embodiments, as shown in FIG. 6A, a plurality of data line connecting portions 316 are arranged at intervals in the second direction D2, for example, located at a boundary between two sub-pixel rows. For example, the two adjacent sub-pixels in the first direction D1 share one data line connecting portion 316.

Referring to FIGS. 6A to 6C, the first conductive layer 301 further includes a connecting electrode 318, which is electrically connected to the first electrode N2D of the driver transistor N2 through a via hole 223 in the second insulating layer 202, and is configured to introduce the first power supply voltage VDD into the first electrode N2D of the driver transistor N2.

Referring to FIGS. 6A to 6C, the first conductive layer 301 further includes a connecting electrode 319, which is bar-like and extends in the first direction D1. The connecting electrode 319 is electrically connected to the first electrode N3D of the storage transistor N3 through a via hole 227a in the second insulating layer 202, and is configured to introduce the ground voltage GND into the first electrode N3D of the storage transistor N3. The connecting electrode 319 is electrically connected to the contact hole region 400a through a via hole 227b in the second insulating layer 202, and is configured to introduce the ground voltage GND into the contact hole region 400a.

Referring to FIGS. 6A to 6C, the first conductive layer 301 further includes a connecting electrode 319a, which extends in the first direction D1. The connecting electrode 319a is electrically connected to the second electrode N3S of the storage transistor N3 through a via hole 228*b* in the second insulating layer 202, and is configured to introduce the ground voltage GND into the second electrode N3S of the storage transistor N3. The connecting electrode 319*a* is electrically connected to the contact hole region 400*a* through a via hole 228*c* in the second insulating layer 202, and is configured to introduce the ground voltage GND into the contact hole region 400*a*. The connecting electrode 319*a* is electrically connected to the contact hole region 400*b* through a via hole 228*d* in the second insulating layer 202, and is configured to introduce the ground voltage GND into the contact hole region 400*b*.

Referring to FIGS. 6A to 6C, the first conductive layer 301 further includes a connecting electrode 319*b*, which extends in the second direction D2. Connecting electrodes 319*b* of the same row of sub-pixels are formed as a continuous structure, forming a connecting line extending in the second direction D2. The connecting electrode 319*b* is electrically connected to the contact hole region 400*a* through a via hole 228*e* in the second insulating layer 202, and is configured to introduce the ground voltage GND into the contact hole region 400*a*.

In some embodiments, there are a plurality of via holes 227*b*, 228*c* and 228*e*, for example, the number is more than or equal to 5, so that the ground voltage GND may be introduced into the contact hole region 400*a* with a larger area. The P-type substrate is connected to the ground voltage GND, that is, the P-type substrate is biased to a low voltage.

Referring to FIGS. 6A to 6C, the first conductive layer 301 further includes a connecting electrode 319*c*, which connects the N-type substrate to the first power supply voltage terminal to receive the first power supply voltage VDD (a high voltage), so that parasitic effects such as offset effect is avoided, and stability of the circuit is improved.

Referring to FIGS. 6A to 6C, the first conductive layer 301 further includes a bias voltage line 310 extending in the second direction D2. The bias voltage line 310 is electrically connected to the gate N5G of the bias transistor N5 through a via hole 229*a* in the second insulating layer 202, and is used for providing the bias voltage Vb to the gate N5G of the bias transistor N5.

Figure 7A:
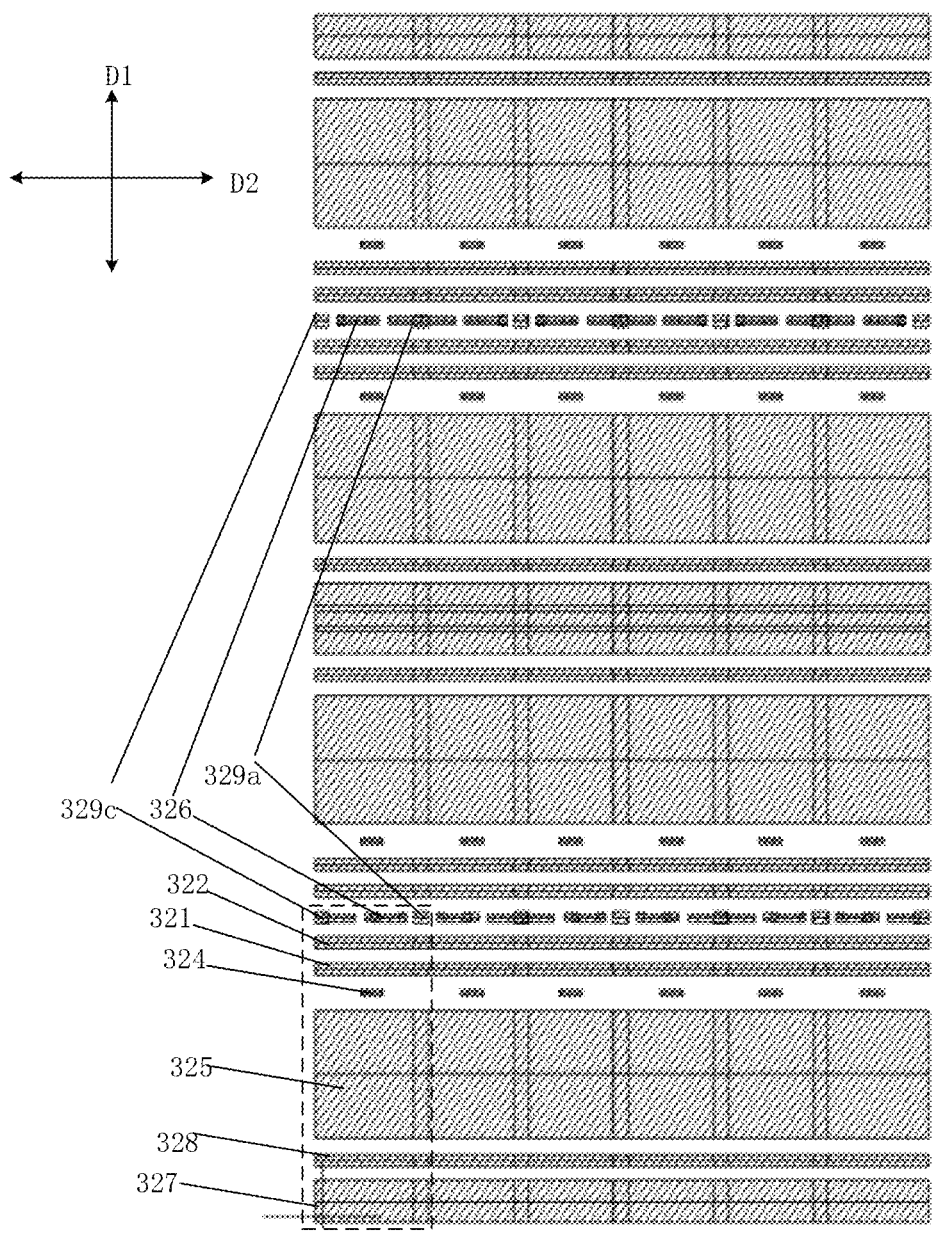
FIGS. 7A to 7B are schematic diagrams of a second conductive layer of a display panel provided by some embodiments of the present disclosure.
Figure 7B:
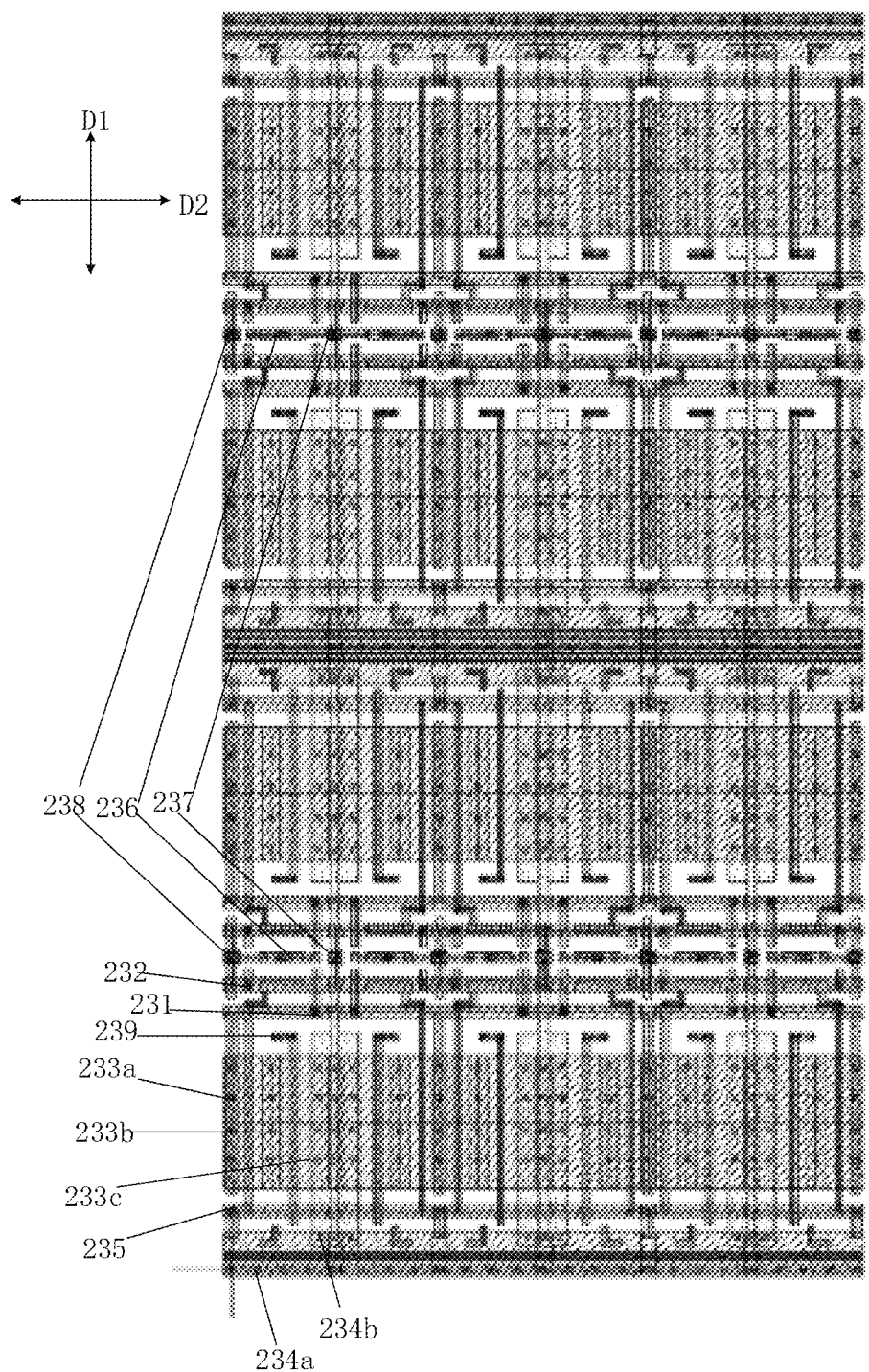

FIG. 7A shows a schematic diagram of the second conductive layer 302, and FIG. 7B shows the second conductive layer 302 on a basis of the first conductive layer 301. FIG. 7B further shows via holes in the third insulating layer 203, and the via holes in the third insulating layer 203 are used for connecting the patterns in the first conductive layer 301 and patterns in the second conductive layer 302. For clarity, only four rows and six columns of sub-pixels are shown in the figure, and an area of a sub-pixel 100 is shown by a dashed box. Those skilled in the art can understand that each layer structure before formation of the first conductive layer 301 is omitted in FIG. 7B.

As shown in FIG. 7A, patterns of second conductive layer in the two adjacent sub-pixels in the first direction D1 are symmetrical relative to the symmetry axis along the second direction D2; patterns of the second conductive layer in the two adjacent sub-pixels in the second direction D2 are symmetrical relative to the symmetry axis along the first direction D1. The patterns of the second conductive layer will be exemplarily described below by taking one sub-pixel as an example.

As shown in FIGS. 7A and 7B, the second conductive layer 302 includes a connecting electrode 324, which is electrically connected to the connecting electrode 314 in the first conductive layer 301 through a via hole 239 in the third insulating layer 203. The connecting electrode 324 is used for electrically connecting to the first electrode 121 of the light-emitting element 120. For example, the connecting electrode 324 is bar-like and extends in the second direction D2.

In some embodiments, the number of via holes 239 may be one or more, as shown in FIG. 7B, for example, the number is two, so as to reduce contact resistance.

In some embodiments, an orthographic projection of the connecting electrode 324 on the base substrate 101 substantially falls within an orthographic projection of the connecting electrode 314 on the base substrate 101. For example, the orthographic projection of the connecting electrode 324 on the base substrate 101 and an orthographic projection of a branch of the connecting electrode 314 extending in the second direction D2 on the base substrate 101 substantially coincide.

As shown in FIGS. 6C, 7A and 7B, for each row of sub-pixels, the second conductive layer 302 includes a first scanning line 321, a second scanning line 322, a ground line 325, a power line 328 and a ground line 327 that all extend in the second direction D2 and are parallel to each other. The first scanning line 321 is configured to transmit the first scanning signal SEL, the second scanning line 322 is configured to transmit the second scanning signal SEL_B, the ground line 325 and the ground line 327 are configured to transmit the ground voltage GND, and the power line 328 is configured to transmit the first voltage signal VDD. The second scanning line 322, the first scanning line 321, the ground line 325, the power supply line 328 and the ground line are sequentially farther away from a center of each N-type well region of the row of sub-pixels in the first direction D1.

In some embodiments, for any two adjacent rows of sub-pixels, each of the first scanning lines 321, the second scanning lines 322, the ground lines 325, the power supply lines 328, and the ground lines 327 are symmetrical relative to the symmetry axis along the second direction D2. For two adjacent rows of sub-pixels, if the two rows of sub-pixels are included in different pixel group rows, the two rows of sub-pixels share one ground line 327.

Referring to FIGS. 7A and 7B in combination, the first scanning line 321 is electrically connected to the first scanning line connecting portion 311 in the first electrode layer 301 through a via hole 231 in the third insulating layer 203, and is used for providing the first scanning signal SEL to the gate N1G of the first data writing transistor N1. The second scanning line 322 is electrically connected to the second scanning line connecting portion 312 in the first electrode layer 301 through a via hole 232 in the third insulating layer 203, and is used t for providing the second scanning signal SEL_B to the gate P1G of the second data writing transistor P1.

Referring to FIGS. 7A and 7B in combination, the ground line 325 is electrically connected to the connecting electrode 319 in the first electrode layer 301 through a via hole 233*a* in the third insulating layer 203, to the connecting electrode 315 in the first electrode layer 301 through a via hole 233*b* in the third insulating layer 203, and to the connecting electrode 319*a* in the first electrode layer 301 through a via hole 233*c* in the third insulating layer 203, so that the first electrode N3D and the second electrode N3S of the storage transistor N3 are electrically connected and both are connected to the ground voltage GND.

In some embodiments, the ground line 325 has a relatively great width and an orthographic projection of the connecting electrode 315 in the first electrode layer 301 on the base substrate 101 falls within an orthographic projection of the ground line 325 on the base substrate 101. In other words, a length of the connecting electrode 315 in the first direction D1 is less than or equal to the width of the ground line 325.

Referring to FIGS. 7A and 7B in combination, the power line 328 is electrically connected to the connecting electrode 318 in the first conductive layer 301 through a via hole 235 in the third insulating layer 203, and is used for providing the first voltage signal VDD to the first electrode N2D of the driver transistor N2 through the connecting electrode 318.

In some embodiments, as shown in FIG. 7A, the power line 328 is a bar-like structure extending in the second direction D2.

Referring to FIGS. 7A and 7B in combination, the ground line 327 is electrically connected to the connecting electrode 319b in the first electrode layer 301 through a via hole 234a in the third insulating layer 203, and is electrically connected to the connecting electrode 319a in the first electrode layer 301 through a via hole 234b in the third insulating layer 203, so that the connecting electrode 319a and the connecting electrode 319b are connected to the ground voltage GND, and then the P-type substrate is low-voltage biased.

Referring to FIGS. 7A and 7B in combination, the second conductive layer 302 further includes a data line connecting portion 326, which is used for electrically connecting to the data line, and is electrically connected to the data line connecting portion 316 in the first conductive layer 301 through a via hole 236 in the third insulating layer 203, so that the second electrode N1S of the first data writing transistor N1 and the second electrode P1S of the second data writing transistor P1 receive the data signal Vd transmitted by the data line.

As shown in FIG. 7B, the data line connecting portion 326 is bar-like and extends in the second direction D2. For example, the data line connecting portion 326 is located at a boundary between two sub-pixel rows. For example, in the same pixel group, the two adjacent sub-pixels in the first direction D1 share one data line connecting portion 326.

In some embodiments, referring to FIGS. 7A and 7B in combination, in the second direction D2, data line connecting portions 326 in each column of sub-pixels are alternately biased towards two sides of corresponding data line connecting portions 316, to connect the data line connecting portions 316 to different data lines.

Referring to FIGS. 7A and 7B in combination, the second conductive layer 302 further includes connecting electrodes 329a and 329c, which are each provided for biasing substrates of transistors. For example, the connecting electrodes 329a and 329c are used for connecting the N-type substrate to the first power supply voltage terminal to receive the first power supply voltage VDD (a high voltage), or for connecting the P-type substrate to the ground voltage terminal to receive the ground voltage GND (a low voltage). Accordingly, parasitic effects such as offset effect may be avoided, and the stability of the circuit may be improved.

Referring to FIGS. 4B, 7A and 7B, the connecting electrodes 329a and 329c are electrically connected to the connecting electrodes 319a and 319c in the first conductive layer through via holes 237 and 238 in the third insulating layer 203, respectively, and are further electrically connected to the contact hole regions 400b and 411 in the base substrate 101. The connecting electrode 329a is used for connecting to the ground voltage GND, so as to bias the P-type substrate where the first data writing transistor N1 is located. The connecting electrode 329b is used for connecting to the first power supply voltage VDD, so as to bias the N-type substrate of the second data writing transistor P1.

As shown in FIGS. 7A and 7B, in any row of pixel groups, a plurality of data line connecting portions 326 are arranged at intervals in the second direction D2, and a connecting electrode 329a or connecting electrode 329c is arranged between two adjacent data line connecting portions 326.

Figure 8A:
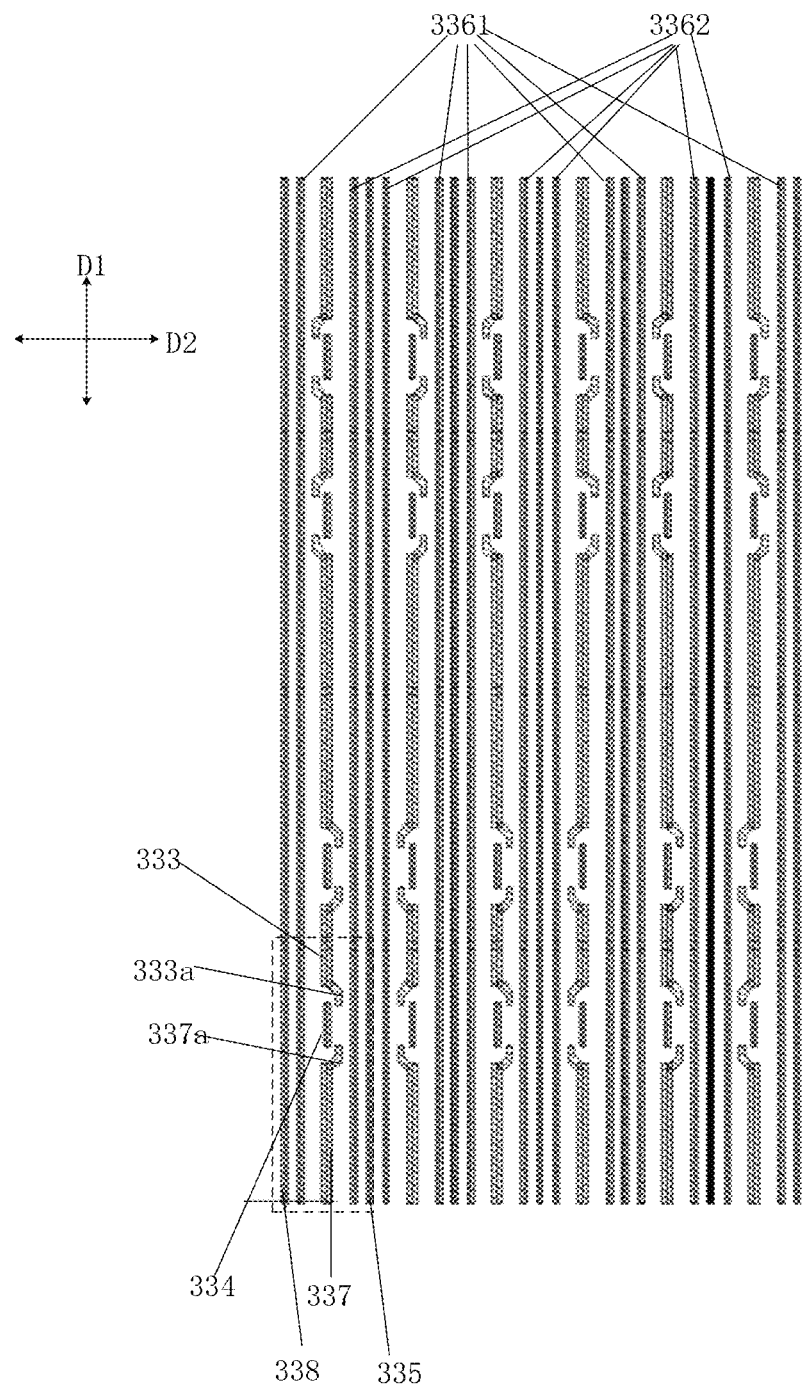
FIGS. 8A to 8B are schematic diagrams of a third conductive layer of a display panel provided by some embodiments of the present disclosure.
Figure 8B:
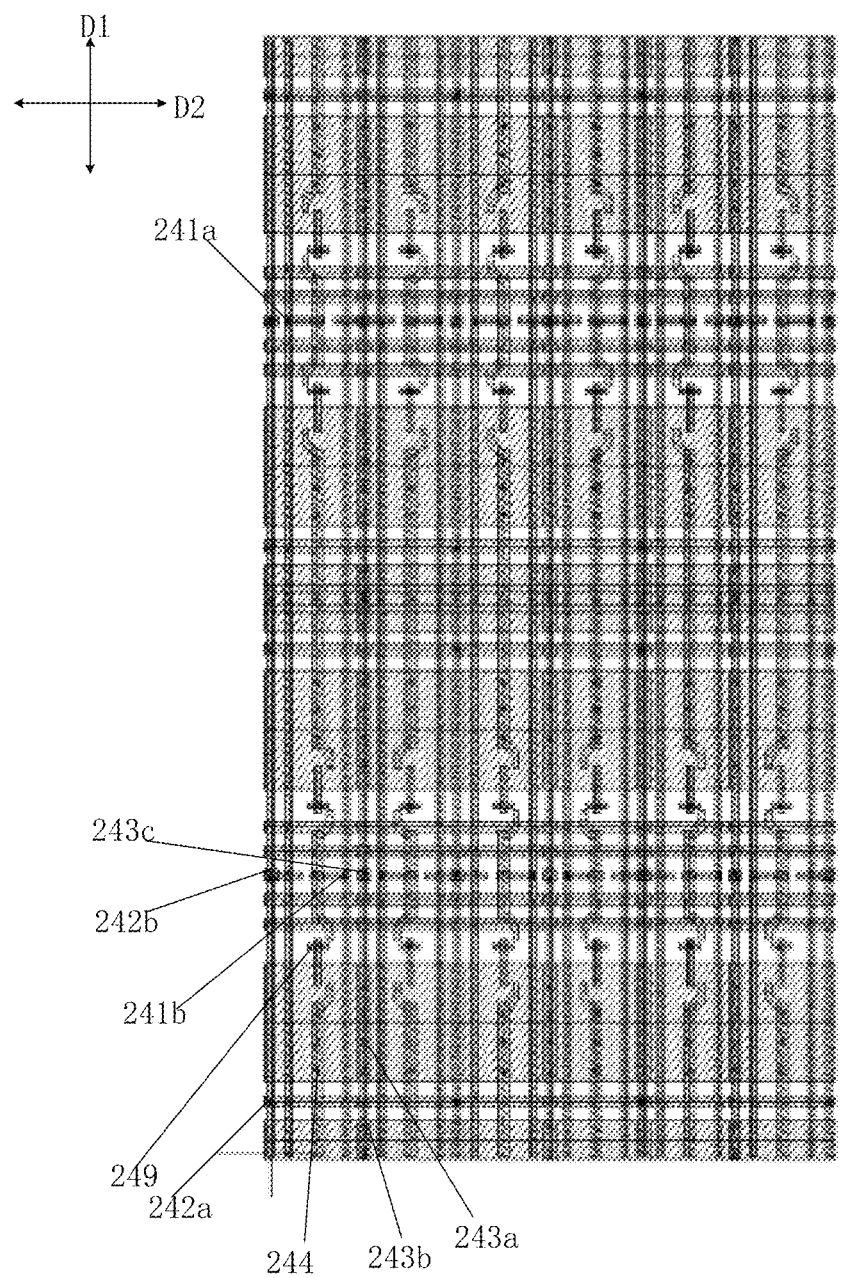

FIG. 8A shows a schematic diagram of the third conductive layer 303. FIG. 8B shows the third conductive layer 303 on a basis of the second conductive layer 302. FIG. 7B further shows a via hole in the fourth insulating layer 204, and the via hole in the fourth insulating layer 204 is used for connecting a pattern in the second conductive layer 302 and a pattern in the third conductive layer 303. For clarity, only four rows and six columns of sub-pixels are shown in the figure, and an area of a sub-pixel 100 is shown by a dashed box. Those skilled in the art can understand that each layer structure before the formation of the first conductive layer 301 is omitted in FIG. 8B.

As shown in FIGS. 8A and 8B, the third conductive layer 303 includes a connecting electrode 334 extending in the first direction D1, and the connecting electrode 334 is electrically connected to the connecting electrode 324 in the second conductive layer 302 through a via hole 249 in the fourth insulating layer 204. The connecting electrode 334 is used for electrically connecting to the first electrode 121 of the light-emitting element 120. For example, the connecting electrode 334 is bar-like and extends in the first direction D1. In some embodiments, an orthographic projection of the connecting electrode 334 on the base substrate 101 and an orthographic projection of the connecting electrode 324 on the base substrate 101 partially overlap.

For example, the third conductive layer 303 includes a plurality of data lines extending in the second direction D2, and the data line is used for connecting to the first terminal of the data writing sub-circuit in sub-pixel to provide the data signal Vd. For example, as shown in FIG. 8A, the plurality of data lines include a plurality of first data lines 3361 and a plurality of second data lines 3362, and the first data lines 3361 and the second data lines 3362 are alternately arranged in the first direction D1. For example, the data line 12 shown in FIG. 1A may be the first data line 3361 or the second data line 3362.

For example, the data lines are divided into a plurality of data line groups, and each data line group includes one first data line 3361 and one second data line 3362. For example, each sub-pixel column is connected to one data line group, that is, each sub-pixel column is connected to one first data line 3361 and one second data line 3362. In other words, one column of sub-pixels is driven by two data lines. This helps to reduce a load on each data line, thereby improving driving capability of the data line, reducing signal delay, and improving the display quality.

Referring to FIG. 8B, the first data line 2361 is electrically connected to a data line connecting portion 326 between a first row of sub-pixels and a second row of sub-pixels in the second conductive layer 302 shown in FIG. 7B through a via hole 241a in the fourth insulating layer 204, so as to provide data signals to the first row of sub-pixels and the second row of sub-pixels. The second data line 2362 is electrically connected to a data line connecting portion 326 between a third row of sub-pixels and a fourth row of sub-pixels in the second conductive layer 302 shown in FIG. 7B through a via hole 241b in the fourth insulating layer 204, so as to provide data signals to the third row of sub-pixels and the fourth row of sub-pixels.

In some embodiments, the third conductive layer 303 includes power lines 338 and ground lines 335 extending in the first direction D1. The power lines 338 are used for transmitting the first power supply voltage VDD, and the ground lines 335 are used for transmitting the ground voltage GND. As shown in FIG. 8A, the power lines 338 and the ground lines 335 are alternately arranged one by one in the first direction D1.

Referring to FIG. 8B, the power lines 338 are respectively electrically connected to the power lines 328 in the second conductive layer 302 through vias hole 242a in the fourth insulating layer 204, so that a meshed power line structure for transmitting the first power supply voltage VDD is formed. This structure may help to reduce resistance on the power line, thereby reducing a voltage drop on the power line, and may help to transmit the first power supply voltage VDD to each sub-pixel of the display substrate evenly. The power line 338 is further electrically connected to the connecting electrode 329c in the second conductive layer 302 through a via hole 242b in the fourth insulating layer, so as to electrically connected to the contact hole region 411 in the second area 402 (an N-well region) in the base substrate 101 to bias the N-type substrate where the first data writing transistor N1 is located.

Referring to FIG. 8B, the ground line 335 is electrically connected to the ground lines 325 and 327 in the second conductive layer 302 through via holes 243a and 243b in the fourth insulating layer 204, respectively, so as to form a meshed power line structure for transmitting ground voltage. This structure may help to reduce resistance on the ground line, thereby reducing a voltage drop on the ground line, and may help to transmit the ground voltage GND to each sub-pixel of the display substrate evenly. The power line 340 is further electrically connected to the connecting electrode 329a in the second conductive layer 302 through a via hole 243c in the fourth insulating layer. The contact hole regions 400b and 400a in the base substrate 101 are both connected to the ground voltage to bias the P-type substrate where the transistors N1 to N5 are located.

As shown in FIGS. 8A and 8B, the third conductive layer 303 further includes a connecting electrode 333 between a first data line 3361 and a second data line 3362 in a data line group. The connecting electrode 333 extends in the first direction D1 and is located between the first data writing transistor N1 and the second data writing transistor P1.

As shown in FIG. 8A and FIG. 8B, the third conductive layer 303 further includes a shielding electrode 337 A. For example, the shielding electrode 337 extends in the first direction D1, and the shielding electrode 337 is between a first data line 3361 and a second data line 3362 of a data line group, for example, the first data line 3361 and the second data line 3362 are symmetrically arranged on both sides of the shielding electrode 337. The shielding electrode 337 is arranged between the two data lines to act as a shield, preventing signal crosstalk between the two data lines. For example, the shielding electrode 337 is configured to receive a constant voltage to improve the shielding ability. In this embodiment, the shielding electrode 337 is used for receiving the ground voltage GND. Specifically, the shielding electrode 337 is electrically connected to the ground line 325 in the second conductive layer 302 through a via hole 244 in the fourth insulating layer 204.

For example, the display substrate includes a plurality of shielding electrodes 337, the plurality of shielding electrodes 337 are arranged in a one-to-one correspondence with the plurality of data line groups, and each shielding electrode is between a first data line and a second data line of a corresponding data line group.

As shown in FIG. 8A, the connecting electrode 333, the connecting electrode 334 and the shield electrode 337 are sequentially arranged in the first direction D1, and are between the first data line 3361 and the second data line 3362. The connecting electrode 333, the connecting electrode 334 and the shielding electrode 337 form a shielding wall, which performs a shielding function in an entire extension range of the first data line 3361 and the second data line 3362, to prevent signal crosstalk between the two data lines.

For example, as shown in FIG. 8A, the connecting electrode 333 and the shielding electrode 337 are respectively located on both sides of the connecting electrode 334 and are spaced apart from the connecting electrode 334. The connecting electrode 333 has a protrusion 333a at an end approximate to the connecting electrode 334. The protrusion 333a extends from a body of the connecting electrode 333 toward one of the first data line 3361 and the second data line 3362 and then extends away from the body of the connecting electrode 333 along the first direction D1, and in the second direction D2, the protrusion 333a overlaps a gap between the connecting electrode 333 and the connecting electrode 334, thereby improving the shielding function and further avoiding signal crosstalk between the two data lines.

Similarly, the shielding electrode 337 has a protrusion 337a at an end approximate to the connecting electrode 334, which is used for further blocking a gap between the shielding electrode 337 and the connecting electrode 334 to improve the shielding function.

In this way, the shielding wall achieves full shielding in the first direction D1 and the first data line 3361 and the second data line 3362 do not directly face each other in the first direction D1, and thus it has a better signal shielding function, which makes display data more stable and improves the display quality.

Figure 9A:
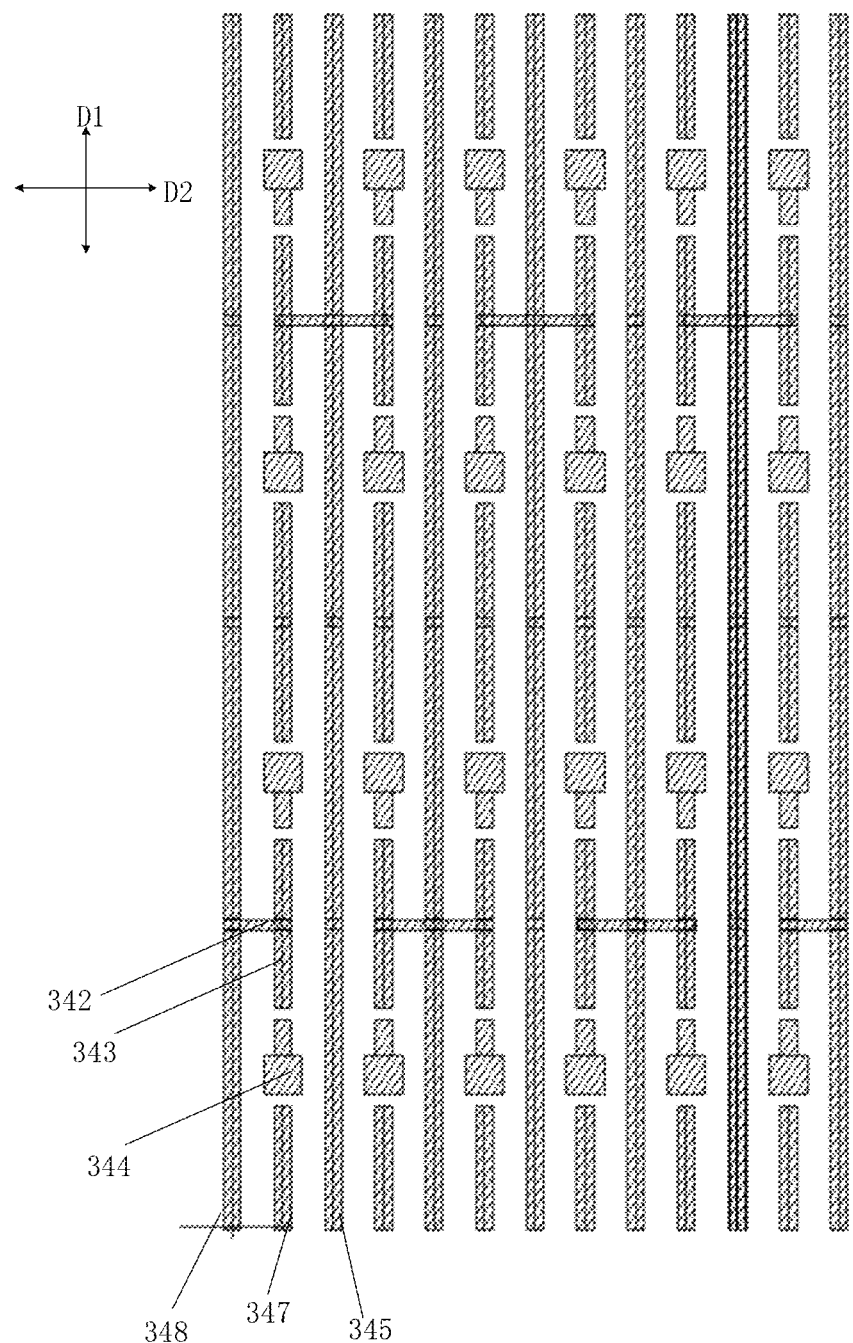
FIGS. 9A to 9B are schematic diagrams of a fourth conductive layer of a display panel provided by some embodiments of the present disclosure.
Figure 9B:
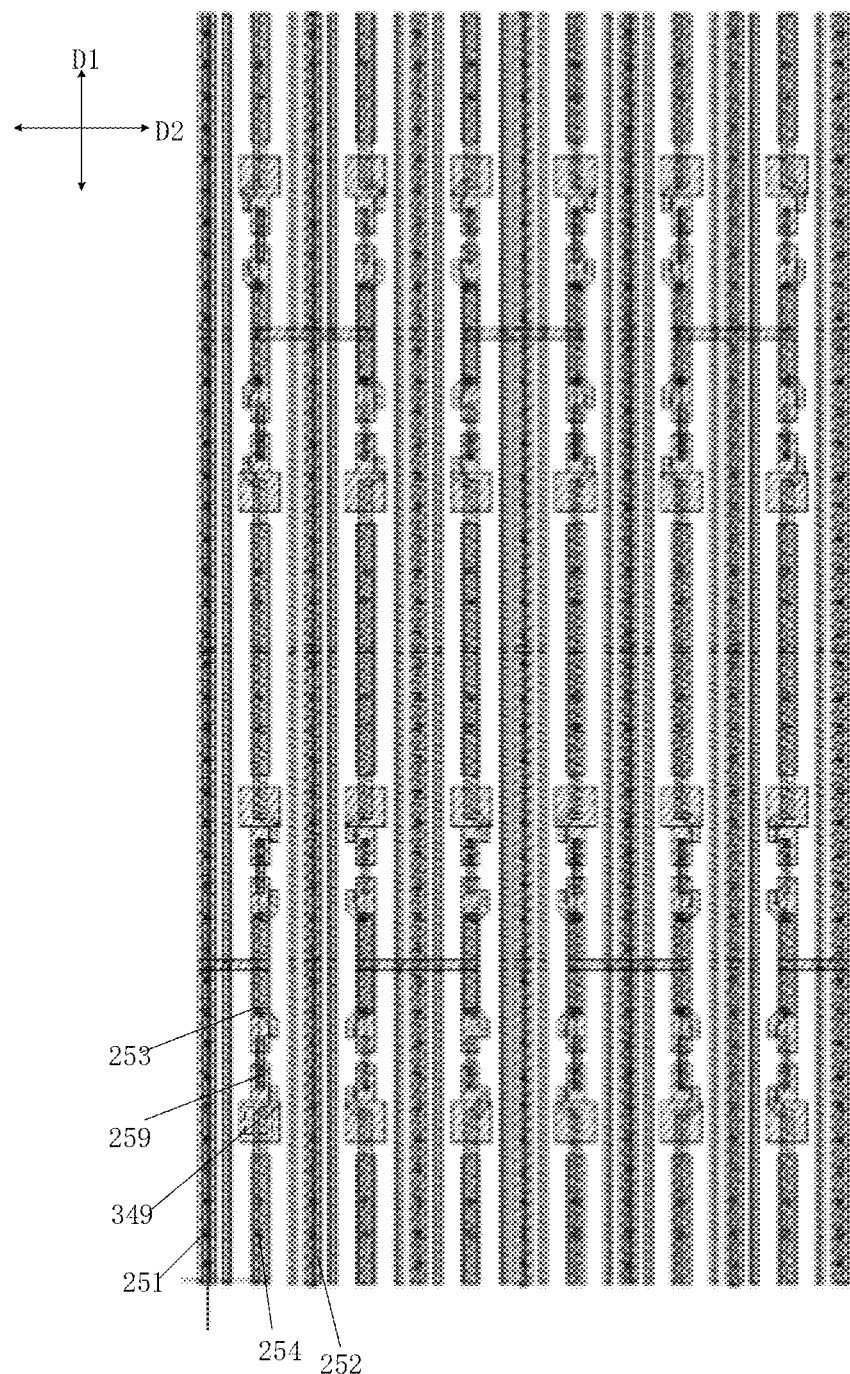

FIG. 9A shows a schematic diagram of the fourth conductive layer 304. FIG. 9B shows the fourth conductive layer 304 on the basis of the third conductive layer 303. FIG. 9B further shows a via hole in the fifth insulating layer 205, the via hole in the fifth insulating layer 205 is used for connecting the pattern in the third conductive layer 303 and the pattern in the fourth conductive layer 304. For clarity, only four rows and six columns of sub-pixels are shown in the figure. Those skilled in the art can understand that each layer structure before the formation of the first conductive layer 301 are omitted in FIG. 9B.

As shown in FIGS. 9A and 9B, the fourth conductive layer 304 includes a connecting electrode 344, which is electrically connected to the connecting electrode 334 in the third conductive layer 303 through a via hole 259 in the fifth insulating layer 205. The connecting electrode 344 is used for electrically connecting to the first electrode 121 of the light-emitting element 120.

In some embodiments, the number of via holes 259 may be one or more, as shown in FIG. 9B, for example, the number is two, to reduce contact resistance.

As shown in FIGS. 9A and 9B, the fourth conductive layer 304 includes a power line 348 and a ground line 345 extending in the first direction D1. The second power line 348 is used for transmitting the first power voltage VDD, and the ground line 345 is used for transmitting the ground voltage GND. As shown in FIG. 9A, the power line 348 and the ground line 345 are alternately arranged one by one in the second direction D2.

For example, a plurality of power lines 348 and a plurality of power lines 338 are arranged in a one-to-one correspondence, and a plurality of ground lines 345 and a plurality of ground lines 335 are arranged in a one-to-one correspondence. In a direction perpendicular to the base substrate 101, each power line 348 overlaps with a corresponding power line 348 and is electrically connected (e.g., in parallel), and each ground line 345 overlaps with a corresponding ground line 335 and is electrically connected (e.g., in parallel). As such, resistance on the power line is reduced and display uniformity is improved.

Referring to FIG. 9B, the power line 348 is electrically connected to the corresponding power line 338 through a via hole 251 in the fifth insulating layer 205, and the ground line 345 is electrically connected to the corresponding ground line 335 through a via hole 252 in the fifth insulating layer. For example, the numbers of via holes 251 and 252 are at least two respectively.

Referring to FIGS. 9A and 9B, the fourth conductive layer 304 further includes a connecting electrode 343, which is electrically connected to the connecting electrode 333 in the third conductive layer 303 through a via hole 253 in the fifth insulating layer, where a width of the connecting electrode 343 is greater than a width of the connecting electrode 333. In some embodiments, an orthographic projection of the connecting electrode 343 on the base substrate 101 covers an orthographic projection of a main part of the connecting electrode 333 on the base substrate 101.

Referring to FIGS. 9A and 9B, the fourth conductive layer 304 further includes a connecting electrode 347, which is electrically connected to the shielding electrode 337 in the third conductive layer 303 through a via hole 254 in the fifth insulating layer.

As shown in FIG. 9A, the fourth conductive layer 304 further includes a connecting portion 342, which connects the connecting electrode 343 to the power line 348 or the ground line 345 directly adjacent to the connecting electrode 343.

As shown in FIG. 9A, for the first and the second rows of sub-pixels, that is, a first row of pixel groups, the connecting portion 342 connects the connecting electrode 343 to the power line 348 directly adjacent to the connecting electrode 343. For the second, third and fourth rows of sub-pixels, that is, a second row of pixel groups, the connecting portion 342 connects the connecting electrode 343 to the power line 345 directly adjacent to the connecting electrode 343.

In some embodiments, as shown in FIG. 9A, the connecting electrodes 343 on both sides of the power line 348 are symmetrically arranged relative to the power line 348, and the power line 348, the connecting electrodes 343 at both sides of the power line 348 and a corresponding connecting portion 342 of the connecting electrodes are connected to each other as a continuous structure.

In some embodiments, as shown in FIG. 9A, the connecting electrodes 343 on both sides of the ground line 345 are symmetrically arranged relative to the ground line 345, and the grounding line 345, the connecting electrodes 343 on both sides of the ground line 345 and a corresponding connecting portion 342 of the connecting electrodes are connected to each other as a continuous structure.

FIG. 9B further shows a contact hole region 349 of the connecting electrode 344, and the contact hole area 349 is used for electrically connecting to the first electrode 121 of the light-emitting element 120. In some embodiments, as shown in FIG. 3B, the display panel 10 further includes a sixth insulating layer 206, and a via hole 267 is formed in the sixth insulating layer 206 corresponding to the contact hole region of the connecting electrode 344, where the via hole 267 is filled with a conductive material (such as tungsten), and then a polishing process (such as chemical mechanical polishing) is performed to form a flat surface for forming the light-emitting element 120.

In some embodiments, the number of the via holes 267 is at least two.

For example, as shown in FIG. 3B, there may be one or more contact hole regions for electrical connection on the connecting electrodes 314, 324, 334 and 344 connected to the first electrode 121 of the light-emitting element 120, so that contact resistance between the connecting electrodes is reduced, thereby reducing contact resistance between the resistor 130 and the first electrode 121 of the light-emitting element 120. Therefore, a voltage drop on a transmission path of the data signal from the resistor 130 to the first electrode 121 is reduced, which may alleviate problems such as color shift and display unevenness due to an anode potential loss (a gray scale loss) caused by the voltage drop, and improve the display quality.

As shown in FIG. 3B, the light-emitting element 120 includes the first electrode 121, a light-emitting layer 123, and the second electrode 122 sequentially arranged in the sixth insulating layer 206. For example, the first electrode 121 and the second electrode 122 are an anode and a cathode of the OLED, respectively. For example, a plurality of first electrodes 121 are arranged at intervals in the same layer, and are in a one-to-one correspondence with the plurality of sub-pixels. For example, the second electrode 122 is a common electrode, and is arranged in the display panel 10 in a whole surface manner.

In some embodiments, as shown in FIG. 3B, the display panel further includes a first encapsulation layer 124, a color film layer 125, a cover plate 126, etc. on a side of the light-emitting element 120 away from the base substrate 101.

For example, the first encapsulation layer 124 is configured to seal the light-emitting element to prevent external moisture and oxygen from seeping into the light-emitting element and the pixel circuit and causing damage to the device. For example, the encapsulation layer 124 includes an organic film or a structure in which an organic film and an inorganic film are alternately stacked. For example, a water-absorbing layer may be provided between the encapsulation layer 124 and the light-emitting element, which is configured to absorb water in a pre-fabrication of the light-emitting element.

In some embodiments, as shown in FIG. 3B, the display panel may further include a second encapsulation layer 127 between the color film layer 125 and the cover plate 126, and the second encapsulation layer 127 may protect the color filter layer 125.

For example, the light-emitting element 120 is configured to emit white light, combining the color film layer 124 to realize a full-color display.

In other examples, the light-emitting element 120 is configured to emit light of three primary colors, and the color film layer 124 is not necessary in this case. The embodiment of the present disclosure does not limit the manner in which the display panel 10 realizes the full-color display.

In some embodiments, the first to fourth conductive layers are made of a metallic material, such as gold (Au), silver (Ag), copper (Cu), aluminum (Al), molybdenum (Mo), magnesium (Mg), tungsten (W), and an alloy material composed of the above metals. For example, the first to fourth conductive layers may also be made of conductive metal oxide materials, such as indium tin oxide (ITO), indium zinc oxide (IZO), zinc oxide (ZnO), zinc aluminum oxide (AZO), etc.

In some embodiments, the first insulating layer to the sixth insulating layer are made of, for example, an inorganic insulating layer material, for example, oxides of silicon, nitrides of silicon or oxynitrides of silicon such as silicon oxide, silicon nitride or silicon oxynitride, or made of aluminum oxide, titanium nitride and the like including metal oxynitride insulating materials.

In some embodiments, the light-emitting element 120 has a top-emitting structure, the first electrode 121 is reflective and the second electrode 122 is transmissive or semi-transmissive. For example, the first electrode 121 is made of a high work function material to serve as an anode, such as a laminated structure of ITO/Ag/ITO; the second electrode 122 is a material with a low work function to serve as a cathode, for example, a semi-transmissive metal or metal alloy material such as an alloy material of Ag/Mg.

Figure 10:
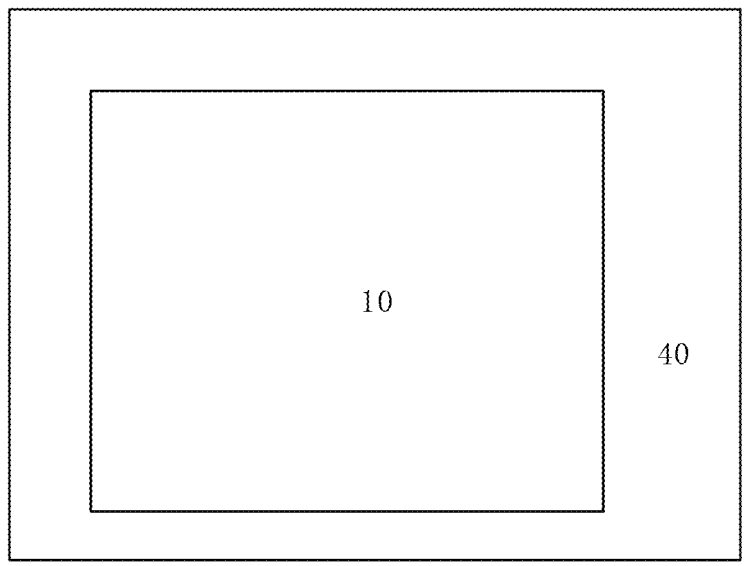
FIG. 10 is a schematic diagram of a display apparatus provided by an embodiment of the present disclosure.

Some embodiments of the present disclosure further provide a display apparatus 40. As shown in FIG. 10, the display apparatus 40 includes any of the above-mentioned display panels 10. The display apparatus in the embodiments may be any product or component with a display function, such as a display, an OLED panel, an OLED TV, an electronic paper, a mobile phone, a tablet computer, a notebook computer, a digital photo frame and a navigator.

The above description is only preferred embodiments of the present disclosure and an explanation of the applied technical principles. Those skilled in the art should understand that the scope of the invention involved in the present disclosure is not limited to the technical solutions formed by the specific combination of the above technical features, and should also cover other technical solutions formed by any combination of the technical solutions described above or their equivalent features without departing from the inventive concept. For example, the above-mentioned features are interchangeable with the technical features disclosed in this disclosure (but not limited to) with similar functions.

What is claimed is:

1. A display panel, comprising a base substrate and a sub-pixel on the base substrate, wherein the sub-pixel comprises a pixel circuit and a light-emitting element, and the pixel circuit comprises a data writing sub-circuit, a storage sub-circuit, a driver sub-circuit and a first sub-circuit, wherein
   the data writing sub-circuit is configured to transmit a data signal to a first terminal of the storage sub-circuit in response to a control signal,
   the driver sub-circuit comprises a control electrode, a first electrode and a second electrode, wherein the control electrode of the driver sub-circuit is coupled to the storage sub-circuit, the first electrode of the driver sub-circuit is configured to receive a first power supply voltage, the second electrode is coupled to a first electrode of the light-emitting element, and the driver sub-circuit is configured to drive the light-emitting element to emit light in response to a voltage of the control electrode, and
   the first sub-circuit comprises a first transistor, wherein a gate of the first transistor and a first electrode of the first transistor are both coupled to the same electrode of the driver sub-circuit; and
   wherein the first transistor is a noise reduction transistor, and
   the driver circuit further comprises a bias transistor, the noise reduction transistor and the bias transistor are connected in series, and each of the noise reduction transistor and the bias transistor comprises a gate, a first electrode and a second electrode, wherein a gate of the noise reduction transistor and a first electrode of the noise reduction transistor are both coupled to the second electrode of the driver sub-circuit, a second electrode of the noise reduction transistor is coupled to a first electrode of the bias transistor, and a gate of the bias transistor is configured to receive a bias voltage, and a second electrode of the bias transistor is configured to receive a predetermined voltage.

2. The display panel according to claim 1, wherein the pixel circuit further comprises a resistor connected in series between the second electrode of the driver sub-circuit and the first electrode of the light-emitting element, the resistor and the control electrode of the driver sub-circuit are in the same layer and arranged separately, and resistivity of the resistor is higher than resistivity of the control electrode of the driver sub-circuit.

3. The display panel according to claim 2, wherein the data writing sub-circuit comprises a transmission gate circuit, the transmission gate circuit comprises a first data writing transistor and a second data writing transistor, each of the first data writing transistor and a second data writing transistor comprises a gate, a first electrode and a second electrode, and the control signal comprises a first control signal and a second control signal, and
   a gate of the first data writing transistor is configured to receive the first control signal, and a gate of the second data writing transistor is configured to receive the second control signal, a first electrode of the first data writing transistor is coupled to a first electrode of the second data writing transistor, each of the first electrode of the first data writing transistor and the first electrode of the second data writing transistor is coupled to the first terminal of the storage sub-circuit and the control electrode of the driver sub-circuit, a second electrode of the first data writing transistor is coupled to a second electrode of the second data writing transistor and each of the second electrode of the first data writing transistor and the second electrode of the second data writing transistor is configured to receive the data signal.

4. The display panel according to claim 3, wherein the driver sub-circuit comprises a driver transistor, and a gate of the driver transistor, a first electrode of the driver transistor and a second electrode of the driver transistor are used as the control electrode of the driver sub-circuit, the first electrode of the driver sub-circuit and the second electrode of the driver sub-circuit, respectively.

5. The display panel according to claim 4, wherein each of the first data writing transistor, the driver transistor, the noise reduction transistor and the bias transistor is an N-type metal-oxide semiconductor field effect transistor, and the second data writing transistor is a P-type metal-oxide semiconductor field effect transistor.

6. The display panel according to claim 5, wherein the resistor and the gate of the noise reduction transistor are arranged in the same layer as a continuous structure.

7. The display panel according to claim 6, wherein the storage sub-circuit comprises a storage capacitor, the storage capacitor comprises a first capacitor electrode and a second capacitor electrode, and the first capacitor electrode and the second capacitor electrode are used as the first terminal of the storage sub-circuit and a second terminal of the storage sub-circuit, respectively, and
   the first capacitor electrode and the resistor are arranged in the same layer and insulated from each other.

8. The display panel according to claim 7, wherein in a first direction parallel to the base substrate, the transmission gate circuit is located on one side of the storage capacitor, and the driver transistor, the noise reduction transistor, the bias transistor and the resistor are located on the other side of the storage capacitor.

9. The display panel according to claim 8, wherein in a second direction parallel to the base substrate and perpendicular to the first direction, the second data writing transistor and the first data writing transistor are arranged in sequence, and the driver transistor, the noise reduction transistor and the bias transistor are arranged in sequence;
    wherein in the first direction, the resistor is between the storage capacitor and a combination of the driver transistor, the noise reduction transistor, and the bias transistor;
    wherein the resistor comprises a plurality of first sub-segments along the first direction and a plurality of second sub-segments along the second direction, and the plurality of first sub-segments and the plurality of second sub-segments are connected end to end to form a bended structure.

10. The display panel according to claim 9, wherein a shortest distance between the driver transistor and the first data writing transistor is greater than a shortest distance between the driver transistor and the second data writing transistor;
    wherein a shortest distance between the bias transistor and the first data writing transistor is less than a shortest distance between the bias transistor and the second data writing transistor;
    wherein a width of the resistor is less than a width of any one of the gate of the first data writing transistor, the gate of the second data writing transistor, the gate of the driver transistor, the gate of the noise reduction transistor, and the gate of the bias transistor.

11. The display panel according to claim 9, wherein the second data writing transistor and the first data writing transistor are arranged side by side along the second direction, and are symmetrical relative to a symmetry axis along the first direction.

12. The display panel according to claim 7, wherein the gate of the first data writing transistor, the gate of the second data writing transistor, the gate of the driver transistor, the gate of the noise reduction transistor, the gate of the bias transistor, the first capacitor electrode and the resistor are arranged in the same layer.

13. The display panel according to claim 7, comprising 4 sub-pixels constituting a pixel unit group,
    wherein the 4 sub-pixels are arranged in an array along a first direction and a second direction perpendicular to the first direction, and
    orthographic projections of second data writing transistors of the 4 sub-pixels on the base substrate are within the same N-type well region in the base substrate.

14. The display panel according to claim 13, wherein resistors of adjacent sub-pixels in the first direction are symmetrical relative to a symmetry axis along the second direction, and resistors of adjacent sub-pixels in the second direction are symmetrical relative to a symmetry axis along the first direction;
    wherein transmission gate circuits of two adjacent sub-pixels in the first direction are symmetrical relative to a symmetry axis along the second direction, and transmission gate circuits of two adjacent sub-pixels in the second direction are symmetrical relative to a symmetry axis along the first direction;
    wherein driver transistors of two adjacent sub-pixels in the first direction are symmetrical relative to a symmetry axis along the second direction, and driver transistors of two adjacent sub-pixels in the second direction are symmetrical relative to a symmetry axis along the first direction;
    wherein noise reduction transistors of two adjacent sub-pixels in the first direction are symmetrical relative to a symmetry axis along the second direction, and noise reduction transistors of two adjacent sub-pixels in the second direction are symmetrical relative to a symmetry axis along the first direction;
    wherein bias transistors of two adjacent sub-pixels in the first direction are symmetrical relative to a symmetry axis along the second direction, and bias transistors of two adjacent sub-pixels in the second direction are symmetrical relative to a symmetry axis along the first direction;
    wherein first capacitor electrodes of adjacent sub-pixels in the first direction are symmetrical relative to a symmetry axis along the second direction, and first capacitor electrodes of adjacent sub-pixels in the second direction are symmetrical relative to a symmetry axis along the first direction.

15. The display panel according to claim 14, wherein orthographic projections of first capacitor electrodes of the 4 sub-pixels on the base substrate are located outside of the N-type well region and are arranged around the N-type well region.

16. The display panel according to claim 5, wherein the second electrode of the driver transistor and the first electrode of the noise reduction transistor are arranged in the same layer as a continuous structure, and/or
    the second electrode of the noise reduction transistor and the first electrode of the bias transistor are arranged in the same layer as a continuous structure.

17. The display panel according to claim 4, wherein the pixel circuit further comprises an isolation structure coupled to the second electrode of the bias transistor and configured to receive a preset voltage.

18. The display panel according to claim 17, wherein an orthographic projection of at least one of the resistor, the driver transistor, the bias transistor, or the noise reduction transistor on the base substrate is surrounded by an orthographic projection of the isolation structure on the base substrate;
    wherein the isolation structure is coupled to a first conductive layer through a plurality of via holes, and a distribution density of the via holes on a side of the isolation structure approximate to the noise reduction transistor is greater than a distribution density of the via holes on a side of the isolation structure approximate to the storage capacitor;
    wherein the isolation structure is an open-loop structure with an opening, and the first electrode of the driver transistor is located at the opening;
    wherein a width of the gate of the bias transistor is greater than a width of the gate of the driver transistor;
    wherein a shortest distance between the gate of the noise reduction transistor and the isolation structure is greater than a shortest distance between the gate of the driver transistor and the isolation structure;
    wherein a total length of the resistor is greater than a total length of the isolation structure.

19. A display apparatus, comprising the display panel according to claim 1.

* * * * *